US011502124B2

(12) United States Patent
Then et al.

(10) Patent No.: US 11,502,124 B2
(45) **Date of Patent: *Nov. 15, 2022**

(54) FILTER-CENTRIC III-N FILMS ENABLING RF FILTER INTEGRATION WITH III-N TRANSISTORS

(71) Applicant: Intel Corporation, Santa Clara, CA (US)

(72) Inventors: Han Wui Then, Portland, OR (US); Paul B. Fischer, Portland, OR (US); Zdravko Boos, Munich (DE); Marko Radosavljevic, Portland, OR (US); Sansaptak Dasgupta, Hillsboro, OR (US)

(73) Assignee: Intel Coropration, Santa Clara, CA (US)

( * ) Notice: Subject to any disclaimer, the term of this patent is extended or adjusted under 35 U.S.C. 154(b) by 790 days.

This patent is subject to a terminal disclaimer.

(21) Appl. No.: 16/249,577

(22) Filed: Jan. 16, 2019

(65) Prior Publication Data

US 2020/0227470 A1 Jul. 16, 2020

(51) Int. Cl.
*H01L 27/20* (2006.01)
*H01L 23/66* (2006.01)
(Continued)

(52) U.S. Cl.
CPC .............. *H01L 27/20* (2013.01); *H01L 23/66* (2013.01); *H01L 29/2003* (2013.01); *H01P 1/2053* (2013.01); *H01L 2223/6677* (2013.01)

(58) Field of Classification Search
CPC ....................................................... H01L 27/20
(Continued)

(56) References Cited

U.S. PATENT DOCUMENTS

2013/0264578 A1 10/2013 Mishra et al.
2019/0081611 A1* 3/2019 Vetury ................. H04B 1/0483
2020/0227470 A1 7/2020 Then et al.

FOREIGN PATENT DOCUMENTS

WO WO-2017111892 A1 * 6/2017 ......... H01L 21/0254
WO 2018004669 A1 1/2018

OTHER PUBLICATIONS

Miller, Larry, "RF Filter Technologies for Dummies, A Wiley Brand," Qorvo Special Edition, Published by John Wiley & Sons, Inc., 111 River St., Hoboken, NJ 07030, Copyright 2015; 28 pages.

* cited by examiner

*Primary Examiner* — Joseph Chang
(74) *Attorney, Agent, or Firm* — Akona IP PC

(57) ABSTRACT

Disclosed herein are IC structures, packages, and devices that include III-N transistors integrated on the same substrate or die as resonators of RF filters. An example IC structure includes a support structure (e.g., a substrate), a resonator, provided over a first portion of the support structure, and an III-N transistor, provided over a second portion of the support structure. The IC structure includes a piezoelectric material so that first and second electrodes of the resonator enclose a first portion of the piezoelectric material, while a second portion of the piezoelectric material is enclosed between the channel material of the III-N transistor and the support structure. In this manner, one or more resonators of an RF filter may be monolithically integrated with one or more III-N transistors. Such integration may reduce costs and improve performance by reducing RF losses incurred when power is routed off chip.

20 Claims, 16 Drawing Sheets

(51) Int. Cl.
*H01P 1/205* (2006.01)
*H01L 29/20* (2006.01)
(58) Field of Classification Search
USPC .......................................................... 331/155
See application file for complete search history.

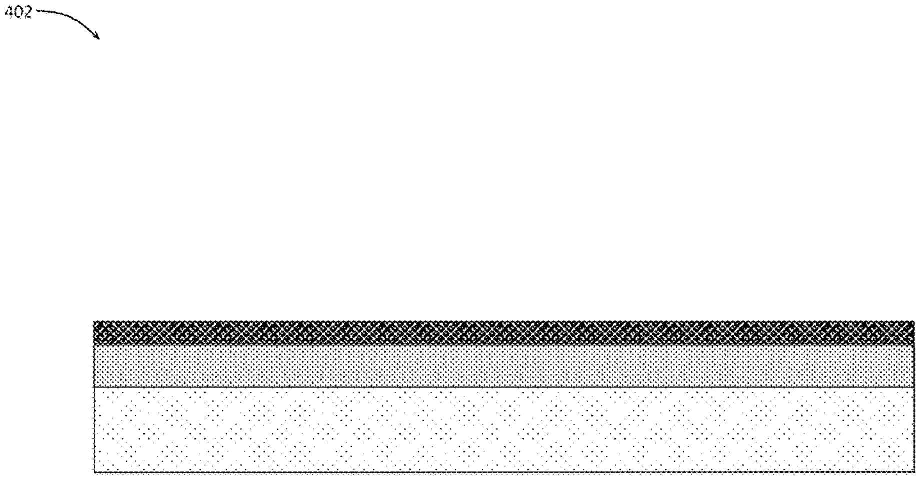
FIG. 4A
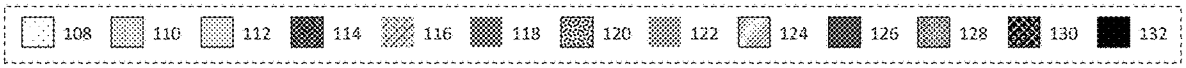

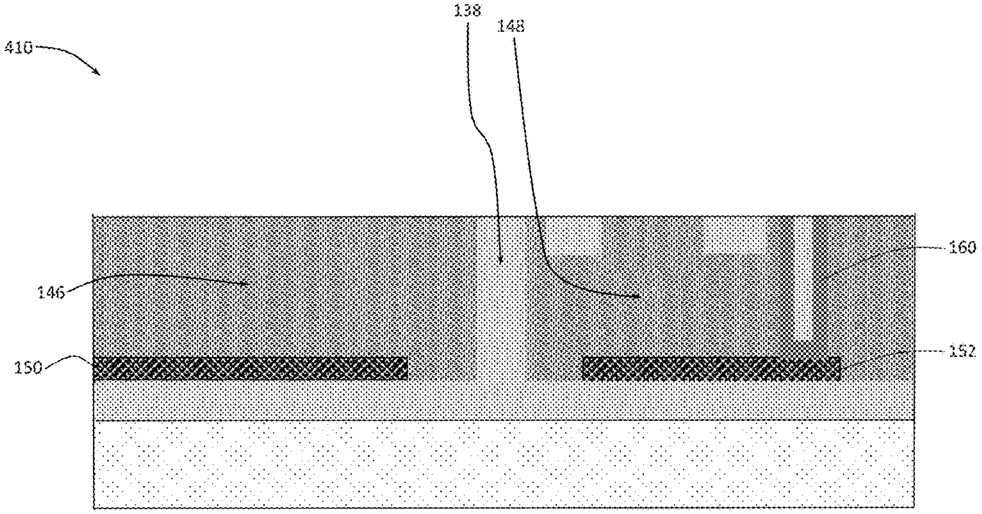
FIG. 4E
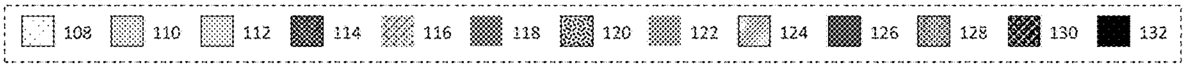

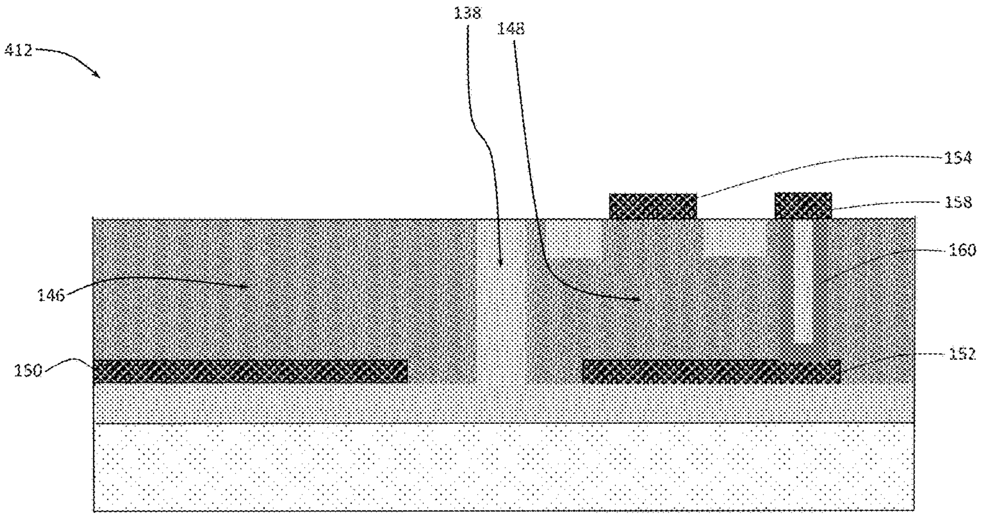
FIG. 4F
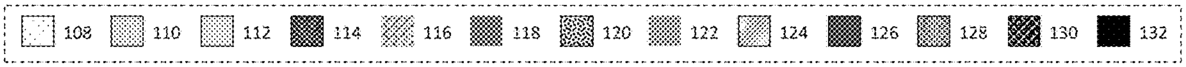

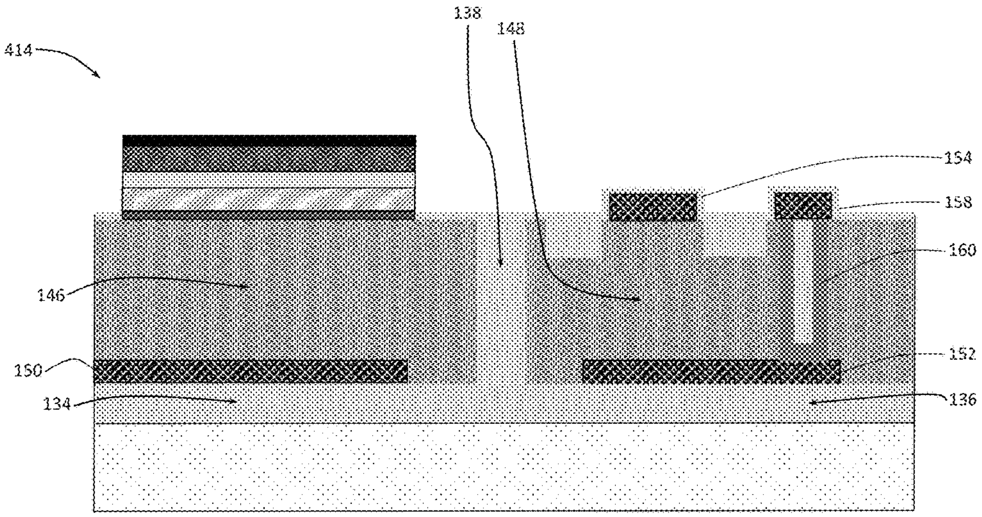
FIG. 4G
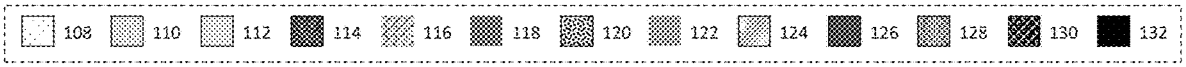

FILTER-CENTRIC III-N FILMS ENABLING RF FILTER INTEGRATION WITH III-N TRANSISTORS

BACKGROUND

Radio frequency (RF) filters are important components in modern communication systems. RF filters may be found in mobile computing platforms such as smartphones, tablets, laptops, netbooks, and the like. With the growing number of bands and modes of communications, the number of RF filters in a mobile front-end (FE) can multiply quickly. Resonators such as film bulk acoustic resonators (FBARs) are at the heart of these filters. A single typical RF filter may, e.g., include 7 such resonators arranged in a half -ladder circuit configuration. A typical RF FE covering 2G/3G and 4G may, e.g., include approximately 17 RF filters, resulting in a total of approximately 119 FBARs. With the advent of 5G in the next few years, RF filters will dominate the costs of RF FE and the total integrated circuit (IC) area available.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 4A-4G are various views illustrating different example stages in the manufacture of an IC structure that includes an III-N transistor integrated with a resonator of an RF filter using the method of FIG. 3, according to some embodiments of the present disclosure.

DETAILED DESCRIPTION

Overview

Figure 1A:
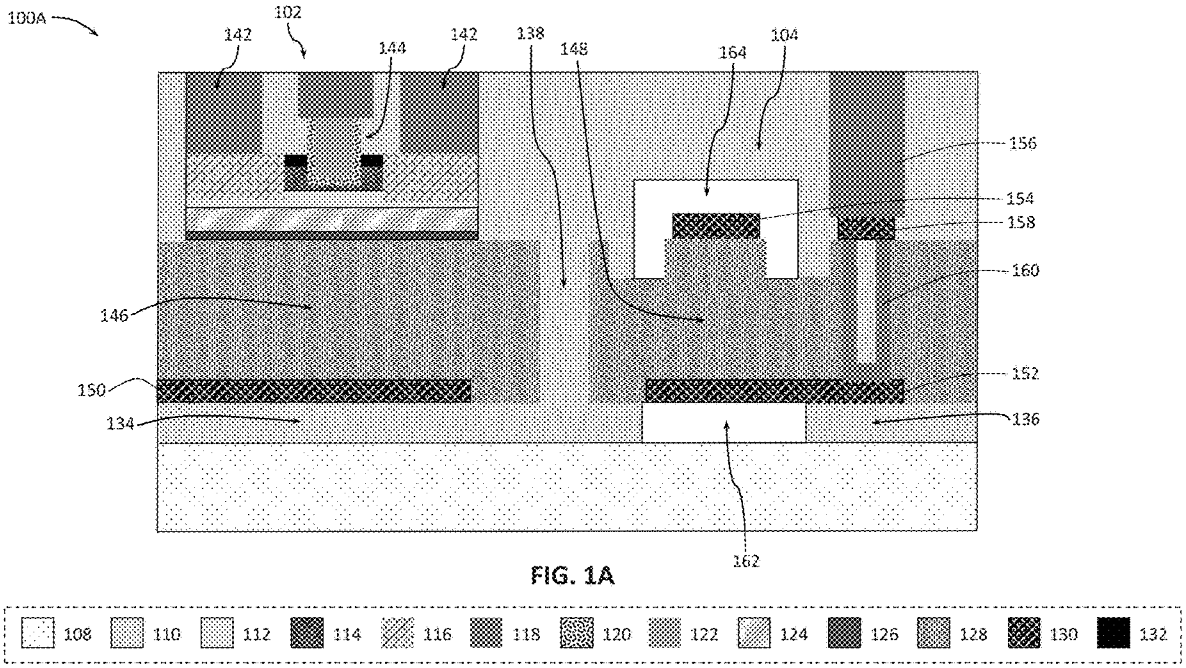
FIG. 1A provides a cross-sectional side view illustrating an IC structure that includes an III-N transistor integrated with a resonator of an RF filter, according to some embodiments of the present disclosure.

An RF FE typically includes multiple components including RF filters, power amplifiers (PAs), switches, and low-noise amplifiers (LNAs). An RF filter may include one or more, typically a plurality of, resonators, e.g., arranged in a ladder configuration. An individual resonator of an RF filter (in the following referred to as an "RF resonator") may include a layer of a piezoelectric material such as aluminum nitride (AlN), usually provided by sputtering, enclosed between a bottom electrode and a top electrode, with a cavity provided around a portion of each electrode in order to allow a portion of the piezoelectric material to vibrate during operation of the filter.

Other components of an RF FE, e.g., PAs, switches, and LNAs, may be implemented using transistors. Due, in part, to their large bandgap and high mobility, III-N material based transistors, e.g., gallium nitride (GaN) based transistors, may be particularly advantageous for implementing such components of RF applications, where the term "III-N transistors" is used to describe transistors that employ materials having one or more of group III semiconductor material(s) and nitrogen (N), e.g., GaN, as active materials, e.g., as a channel material of a transistor. For example, because GaN has a larger band gap (about 3.4 electronvolts (eV)) than silicon (Si; bandgap of about 1.1 eV), a GaN transistor is expected to withstand a larger electric field (resulting e.g., from applying a large voltage to the drain, Vdd) before suffering breakdown, compared to a Si transistor of similar dimensions. Furthermore, GaN transistors may advantageously employ a two-dimensional (2D) electron gas (2DEG), i.e., a group of electrons (an electron gas) free to move in two dimensions but tightly confined in the third dimension (e.g., a 2D sheet charge), as its transport channel, enabling high mobilities without using impurity dopants. For example, the 2D sheet charge may be formed at an abrupt hetero-interface formed by epitaxial deposition, on GaN, of a charge-inducing film of a material having larger spontaneous and piezoelectric polarization, compared to GaN (such a film is generally referred to as a "polarization layer"). Providing a polarization layer on an III-N material such as GaN allows forming very high charge densities, e.g., densities of about $2 \cdot 10^{13}$ charges per square centimeter ($cm^2$), without impurity dopants, which, in turn, enables high mobilities, e.g., mobilities greater than about 1000 $cm^2/(V \cdot s)$.

Typically, a channel material for an III-N transistor is provided over a crystalline substrate by epitaxial growth, with the crystalline substrate serving as an ordered template for the epitaxial growth of the III-N channel material. Sometimes, a buffer layer may be provided over the substrate, and then the III-N channel material layer is grown over the buffer layer. A buffer layer is a layer of a semiconductor material that has a bandgap larger than that of the channel material, so that the buffer layer can serve to prevent current leakage from the future III-N transistors to the substrate and to enable better epitaxy of the channel material (i.e., to improve epitaxial growth of the channel material in terms of e.g., bridge lattice constant, amount of defects, etc.). For example, GaN may be used as the channel material, while AlGaN may be used as the buffer layer.

Because of these drastically different manufacturing needs and processes used to implement RF filters and III-N transistors of an RF FE, RF filters have, conventionally, been implemented as standalone products, packaged with other RF FE components such as PAs, switches, and LNAs in a multi-chip module. In other words, because of the need for the bottom electrodes and sputtered piezoelectric materials for implementing RF filters, and the need for crystalline substrates to serve as ordered templates for the epitaxial growth of III-N channel materials for implementing III-N transistors, conventionally, RF filters and other RF FE components have been implemented on different substrates.

Disclosed herein are IC structures, packages, and device assemblies that include III-N transistors integrated on the same support structure/material (which may be, e.g., a substrate, a die, or a chip) as resonators of RF filters. Embodiments of the present disclosure are based on recognition that III-N materials used in implementing III-N transistors are also piezoelectric, similar to the piezoelectric material used to implement resonators of RF filters, thereby providing a possibility for integrating III-N transistors on a single support structure with such resonators. In particular, according to various embodiments of the present disclosure, the sputtered piezoelectric material used to form an RF resonator is also used as an ordered template from which epitaxial growth of a channel material for an III-N transistor can originate, instead of a crystalline substrate material as was done in conventional implementations of III-N transistors, advantageously enabling integration of III-N transistors on the same support structure as RF resonators/filters.

In one aspect of the present disclosure, an IC structure is provided, the IC structure including a support structure (e.g., a substrate), an RF resonator provided over a first portion of the support structure, and an III-N transistor provided over a second portion of the support structure. In particular, the IC structure includes a piezoelectric material so that the first and second electrodes of the RF resonator at least partially enclose (sandwich) a first portion of the piezoelectric material, while a second portion of the piezoelectric material is at least partially enclosed between the III-N channel material of the III-N transistor and the support structure (in various embodiments, the first and second portions of the piezoelectric material may include the same or different piezoelectric materials). In this manner, one or more RF resonators may be, advantageously, monolithically integrated with one or more III-N transistors, enabling monolithic integration of all RF FE components, i.e., RF filters, PAs, switches, LNAs, etc., on a single chip. Such integration may reduce costs and improve performance by reducing RF losses incurred when power is routed off chip in a multi-chip module package.

In another aspect of the present disclosure, an IC structure includes an III-N transistor having an III-N channel material provided over the support structure, and further includes a sputtered III-N material between the III-N channel material and the support structure, and an epitaxially grown III-N material between the sputtered III-N material and the III-N channel material. Other aspects of the present disclosure provide other IC structures, IC packages and computing devices that include such IC structures, and methods of manufacturing such IC structures, IC packages and devices. In this manner, III-N transistors may be provided over any support structure, advantageously eliminating the requirement of having crystalline substrates present in the conventional implementations of such transistors.

As used herein, the term "III-N material" refers to a compound semiconductor material with a first sub-lattice of at least one element from group III of the periodic table (e.g., Al, Ga, In) and a second sub-lattice of nitrogen (N). As used herein, the term "III-N device" (e.g., an III-N transistor) refers to a device that includes an III-N material (which may include one or more different III-N materials, e.g., a plurality of different III-N materials stacked over one another) as an active material.

While various embodiments described herein refer to III-N transistors (i.e., transistors employing one or more III-N materials as an active channel material), these embodiments are equally applicable to any other III-N devices besides III-N transistors, such as III-N diodes, sensors, light-emitting diodes (LEDs), and lasers (i.e., other device components employing one or more III-N materials as active materials). Furthermore, while the following discussions may refer to the two-dimensional charge carrier layers as "2DEG" layers, embodiments described herein are also applicable to systems and material combinations in which 2D hole gas (2DHG) may be formed, instead of 2DEG. Thus, unless stated otherwise, embodiments referring to 2DEG are equally applicable to implementing 2DHG instead, all of such embodiments being within the scope of the present disclosure.

Each of the structures, packages, methods, devices, and systems of the present disclosure may have several innovative aspects, no single one of which being solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," etc. refer to compounds containing, respectively, oxygen, carbon, nitrogen, etc. Similarly, the terms naming various compounds refer to materials having any combination of the individual elements within a compound (e.g., "gallium nitride" or "GaN" refers to a material that includes gallium and nitrogen, "aluminum indium gallium nitride" or "AlInGaN" refers to a material that includes aluminum, indium, gallium and nitrogen, and so on). Further, the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20%, preferably within +/−10%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 5A-5B, such a collection may be referred to herein without the letters, e.g., as "FIG. 5." In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated.

In the drawings, some schematic illustrations of example structures of various structures, devices, and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC structures that include at least one III-N device (e.g., a III-N transistor) integrated with at least one RF resonator over a single support structure as described herein may be implemented in one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on an IC, provided as an integral part of an IC, or those connected to an IC. The IC may be either analog or digital and may be used in a number of applications, such as microprocessors, optoelectronics, logic blocks, audio amplifiers, etc., depending on the components associated with the IC. In some embodiments, IC structures as described herein may be included in a RFIC, which may, e.g., be included in any component associated with an IC of an RF receiver, an RF transmitter, or an RF transceiver, e.g., as used in telecommunications within base stations (BS) or user equipment (UE). Such components may include, but are not limited to, PAs, LNAs, RF filters (including arrays of RF filters, or RF filter banks), switches, upconverters, downconverters, and duplexers. In some embodiments, the IC structures as described herein may be employed as part of a chipset for executing one or more related functions in a computer. Integrating an III-N transistor with an RF resonator FIG. 1A provides a cross-sectional side view illustrating an IC structure 100A that includes an III-N transistor 102 integrated with a resonator 104 of an RF filter, according to some embodiments of the present disclosure. A legend provided within a dashed box at the bottom of FIG. 1A illustrates colors/patterns used to indicate some classes of materials of some of the elements shown in FIG. 1A, so that FIG. 1A is not cluttered by too many reference numerals. For example, FIG. 1A uses different colors/patterns to identify a support structure 108 (which may be referred to, interchangeably, as a "substrate 108"), an insulator 110, an III-N channel material 112, a polarization material 114, source/drain (S/D) regions 116, an electrically conductive material 118 used to implement contacts to various electrodes, a gate dielectric material 120, a gate electrode material 122, a buffer layer material 124, an epitaxially grown piezoelectric III-N material 126, a sputtered piezoelectric III-N material 128, an electrically conductive material 130 used to implement various electrodes, and a hard-mask material 132.

The support structure 108 may be any suitable structure, e.g., a substrate, a die, or a chip, on which RF resonators and III-N transistors as described herein may be implemented. In some embodiments, the support structure 108 may include a semiconductor, such as silicon. In other implementations, the support structure 108 may include/be alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N or group IV materials.

In some embodiments, the support structure 108 may include a ceramic material, or any other non-semiconductor material. For example, in some embodiments, the support structure 108 may include glass, a combination of organic and inorganic materials, embedded portions having different materials, etc. Although a few examples of materials from which the support structure may be formed are described here, any material that may serve as a foundation upon which at least RF resonators and III-N transistors as described herein may be built falls within the spirit and scope of the present disclosure.

In some embodiments, the support structure 108 may include an insulating layer, such as an oxide isolation layer. For example, in the embodiment of FIG. 1A, a layer of the insulator 110 is shown to be provided over the support structure 108. The insulator 110 may include any suitable insulating material, e.g., any suitable interlayer dielectric (ILD), to electrically isolate the semiconductor material of the support structure 108 from other regions of or surrounding the III-N transistor 102 and/or from other regions of or surrounding the resonator 104. Providing such an insulating layer over the support structure 108 may help mitigate the likelihood that conductive pathways will form through the support structure 108 (e.g., a conductive pathway between the source and drain regions 116). Examples of the insulator 110 may include, in some embodiments, silicon oxide, silicon nitride, aluminum oxide, and/or silicon oxynitride. In general, FIG. 1A illustrates that the insulator 110 may be provided in various portions of the IC structure 100A, such as a portion 134 provided between the III-N transistor 102 and the support structure 108, a portion 136 provided between the RF resonator 104 and the support structure 108, and a portion 138 provided between the RF resonator 104 and the III-N transistor 102. In various embodiments, the insulator 110 may include different insulating materials in different portions of the IC structure 100A.

In some embodiments, the III-N channel material 112 may be formed of a compound semiconductor with a first sub-lattice of at least one element from group III of the periodic table (e.g., Al, Ga, In), and a second sub-lattice of nitrogen (N). In some embodiments, the III-N channel material 112 may be a binary, ternary, or quaternary III-N compound semiconductor that is an alloy of two, three, or even four elements from group III of the periodic table (e.g., boron, aluminum, indium, gallium) and nitrogen.

In general, the III-N channel material 112 may be composed of various III-N semiconductor material systems including, for example, N-type or P-type III-N materials systems, depending on whether the transistor 102 is an N-type or a P-type transistor. For some N-type transistor embodiments, the III-N channel material 112 may advantageously be an III-N material having a high electron mobility, such as, but not limited to GaN, InGaAs, InP, InSb, and InAs. For some $In_xGa_{1-x}As$ embodiments, In content (x) may be between 0.6 and 0.9, and advantageously is at least 0.7 (e.g., $In_{0.7}Ga_{0.3}As$). For some such embodiments, the III-N channel material 112 may be a ternary III-N alloy, such as InGaN, or a quaternary III-N alloy, such as AlInGaN.

In some embodiments, the III-N channel material 112 may be formed of a highly crystalline semiconductor, e.g., of substantially a monocrystalline semiconductor (possibly with some limited amount of defects, e.g., dislocations). The quality of the III-N channel material 112 (e.g., in terms of defects or crystallinity) may be higher than that of other III-N materials of, or near, the III-N transistor 102 since, during the operation of the III-N transistor 102, a transistor channel will form in the III-N channel material 112.

In some embodiments, the III-N channel material 112 may be an intrinsic III-N semiconductor material or alloy, not intentionally doped with any electrically active impurity. In alternate embodiments, one or more a nominal impurity dopant level may be present within the III-N channel material 112, for example to set a threshold voltage Vt of the transistor 102, or to provide halo pocket implants, etc. In such impurity-doped embodiments however, impurity dopant level within the III-N channel material 112 may be relatively low, for example below $10^{15}$ dopants per cubic centimeter ($cm^{-3}$), or below $10^{13}$ $cm^{-3}$.

In various embodiments, a thickness of the III-N channel material 112 may be between about 5 and 2000 nanometers, including all values and ranges therein, e.g., between about 50 and 1000 nanometers, or between about 10 and 50 nanometers. Unless specified otherwise, all thicknesses described herein refer to a dimension measured in a direction perpendicular to the support structure 108.

Turning now to the polarization material 114 of the III-N transistor 102, in general, the polarization material 114 may be a layer of a charge-inducing film of a material having larger spontaneous and/or piezoelectric polarization than that of the bulk of the III-N layer material immediately below it (e.g., the III-N channel material 112), creating a heterojunction (hetero-interface) with the III-N channel material 112, and leading to formation of 2DEG at or near (e.g., immediately below) that interface, during operation of the transistor 102. As described above, a 2DEG layer may be formed during operation of an III-N transistor in a layer of an III-N semiconductor material immediately below a suitable polarization layer. In various embodiments, the polarization material 114 may include materials such as AlN, InAlN, AlGaN, or $Al_xIn_yGa_{1-x-y}N$, and may have a thickness between about 1 and 50 nanometers, including all values and ranges therein, e.g., between about 5 and 15 nanometers or between about 10 and 30 nanometers.

As also shown in FIG. 1A, the III-N transistor 102 may include two S/D regions 116, where one of the S/D regions 116 is a source region and another one is a drain region, where the source and drain designations may be interchangeable. As is well-known, in a transistor, S/D regions (also sometimes interchangeably referred to as "diffusion regions") are regions that can supply charge carriers for the transistor channel (e.g., the transistor channel 112) of the transistor (e.g., the III-N transistor 102). In some embodiments, the S/D regions 116 may include highly doped semiconductor materials, such as highly doped InGaN. Often, the S/D regions may be highly doped, e.g., with dopant concentrations of at least above $1 \cdot 10^{21}$ $cm^{-3}$, in order to advantageously form Ohmic contacts with the respective S/D electrodes of the III-N transistor 102 (e.g., electrodes 142 shown in FIG. 1A, made of the electrically conductive material 118), although these regions may also have lower dopant concentrations in some implementations. Regardless of the exact doping levels, the S/D regions 116 are the regions having dopant concentration higher than in other regions between the source region (e.g., the region 116 shown on the left side in FIG. 1A) and the drain region (e.g., the region 116 shown on the right side in FIG. 1A), i.e., higher than the III-N channel material 112. For that reason, sometimes the S/D regions are referred to as highly doped (HD) S/D regions. In further embodiments, one or more layers of metal and/or metal alloys may be used to form the S/D regions 116.

The electrically conductive material 118 of the S/D electrodes 142 may include any suitable electrically conductive material, alloy, or a stack of multiple electrically conductive materials. In some embodiments, the S/D electrodes 142 may include one or more metals or metal alloys, with metals such as copper, ruthenium, palladium, platinum, cobalt, nickel, hafnium, zirconium, titanium, tantalum, and aluminum, tantalum nitride, titanium nitride, tungsten, doped silicon, doped germanium, or alloys and mixtures of these. In some embodiments, the S/D electrodes 142 may include one or more electrically conductive alloys, oxides, or carbides of one or more metals. In some embodiments, the S/D electrodes 142 may include a doped semiconductor, such as silicon or another semiconductor doped with an N-type dopant or a P-type dopant. Metals may provide higher conductivity, while doped semiconductors may be easier to pattern during fabrication. In some embodiments, the S/D electrodes 142 may have a thickness between about 2 nanometers and 1000 nanometers, preferably between about 2 nanometers and 100 nanometers.

FIG. 1A further illustrates a gate stack 144 provided over the channel portion of the III-N channel material 112. The gate stack 144 includes a layer of a gate dielectric material 120, and a gate electrode material 122.

The gate dielectric material 120 is typically a high-k dielectric material, e.g., a material including elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric material 120 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric material 120 during manufacture of the transistor 102 to improve the quality of the gate dielectric material 120. A thickness of the gate dielectric material 120 may be between 0.5 nanometers and 3 nanometers, including all values and ranges therein, e.g., between 1 and 3 nanometers, or between 1 and 2 nanometers.

The gate electrode 122 may include at least one P-type work function metal or N-type work function metal, depending on whether the transistor 102 is a PMOS transistor or an NMOS transistor (e.g., P-type work function metal may be used as the gate electrode 122 when the transistors 102 is a PMOS transistor and N-type work function metal may be used as the gate electrode 122 when the transistor 102 is an NMOS transistor, depending on the desired threshold voltage). For a PMOS transistor, metals that may be used for the gate electrode material 122 may include, but are not limited to, ruthenium, palladium, platinum, cobalt, nickel, titanium nitride, and conductive metal oxides (e.g., ruthenium oxide). For an NMOS transistor, metals that may be used for the gate electrode 122 include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and nitrides of these metals (e.g., tantalum nitride, and tantalum aluminum nitride). In some embodiments, the gate electrode material 122 may include a stack of two or more metal layers, where one or more metal layers are work function metal layers and at least one metal layer is a fill metal layer.

Further layers may be included next to the gate electrode material 122 for other purposes, such as to act as a diffusion barrier layer or/and an adhesion layer, not specifically shown in FIG. 1A. Furthermore, in some embodiments, the gate dielectric material 120 and the gate electrode material 122 may be surrounded by a gate spacer, not shown in FIG. 1A, configured to provide separation between the gates of different transistors. Such a gate spacer may be made of a low-k dielectric material (i.e., a dielectric material that has a lower dielectric constant (k) than silicon dioxide which has a dielectric constant of 3.9). Examples of low-k materials that may be used as the dielectric gate spacer may include, but are not limited to, fluorine-doped silicon dioxide, carbon-doped silicon dioxide, spin-on organic polymeric dielectrics such as polyimide, polynorbornenes, benzocyclobutene, and polytetrafluoroethylene (PTFE), or spin-on silicon-based polymeric dielectric such as hydrogen silsesquioxane (HSQ) and methylsilsesquioxane (MSQ)). Other examples of low-k materials that may be used as the dielectric gate spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1.

In some embodiments, the IC structure 100A may, optionally, include a buffer material 124 between the III-N channel material 112 and the rest of the III-N materials below the buffer material 124 (i.e., the epitaxially grown III-N material 126 and the sputtered III-N material 128). Such a buffer layer may be included to electrically isolate the semiconductor materials that are the epitaxially grown III-N material 126 and the sputtered III-N material 128 from the III-N channel material 112, and, thereby, mitigate the likelihood that conductive pathways will form between, e.g., a source and a drain regions of the III-N transistor 102, or between neighboring III-N transistors (not specifically shown in FIG. 1A), through the epitaxially grown III-N material 126 and the sputtered III-N material 128. In some embodiments, the buffer material 124 may be a layer of a semiconductor material that has a bandgap larger than that of the III-N channel material 112, so that the buffer material 124 can serve to prevent current leakage from the future III-N transistors to the epitaxially grown III-N material 126 and the sputtered III-N material 128. A properly selected semiconductor for the buffer material 124 may also enable better epitaxy of the III-N channel material 112 thereon, e.g., it may improve epitaxial growth of the III-N channel material 112, for instance in terms of a bridge lattice constant or amount of defects. For example, a semiconductor that includes aluminum, gallium, and nitrogen (e.g., AlGaN) or a semiconductor that includes aluminum and nitrogen (e.g., AlN) may be used as the buffer material 124 when the III-N channel material 112 is a semiconductor that includes gallium and nitrogen (e.g., GaN). Other examples of materials for the buffer material 124 may include materials typically used as ILD, described above, such as oxide isolation layers, e.g., silicon oxide, silicon nitride, aluminum oxide, and/or silicon oxynitride. When implemented in the III-N transistor 102, the buffer material 124 may have a thickness between about 100 and 5000 nm, including all values and ranges therein, e.g., between about 200 and 1000 nanometers, or between about 250 and 500 nanometers.

The epitaxially grown piezoelectric material 126 and a portion of the sputtered piezoelectric material 128 that is below the III-N channel material 112 may be considered to be a part of the III-N transistor 102. As shown in FIG. 1A, the sputtered piezoelectric material 128 may be disposed between the epitaxially grown piezoelectric material 126 and the support structure 108, while the epitaxially grown piezoelectric material 126 may be disposed between the sputtered piezoelectric material 128 and the III-N channel material 112 (or the buffer material 124, in case the buffer layer is used). As the names suggest, the epitaxially grown piezoelectric material 126 is a material provided by epitaxial deposition/growth (e.g., using chemical vapor deposition (CVD), e.g., using metalorganic CVD (MOCVD)), while the sputtered piezoelectric material 128 is a material provided by sputtering. In various embodiments, both materials 126 and 128 may include substantially the same chemical compositions, e.g., both may include an III-N material such as, e.g., AlN, but different methods of their deposition result in different characteristics of these materials. In particular, the epitaxially grown material 122 may be a substantially single crystalline material, possibly defective, i.e., including a certain amount of dislocations, while the sputtered material 128 may include a plurality of different crystalline domains (i.e., the sputtered material 128 is not a single crystalline material), a difference that will be readily visible in an image of a suitable characterization tool, e.g., in a TEM image. As a result of different crystallinity of the materials 126 and 128, their X-ray diffraction (another characterization tool) peaks will be different. In some embodiments, a full width half maximum (FWHM) of an X-ray diffraction peak of the epitaxially grown material 126 may be less than 2 degrees, while the FWHM of an X-ray diffraction peak of the sputtered material 128 may be equal to or greater than 2 degrees. In other embodiments, the threshold value could be different than 2 degrees, which is just a rule-of-thumb value. In general, a FWHM of an X-ray diffraction peak of the epitaxially grown material 126 may be less than a FWHM of an X-ray diffraction peak of the sputtered material 128, indicating their different crystalline properties due to the different techniques used to deposit these materials (epitaxial growth and sputtering, respectively).

The sputtered material 128 may, advantageously, be deposited over any surface, e.g., over the insulator 110, over the support structure 108, and/or over the electrically conductive material 130. While the quality of the sputtered III-N material 128 may not be sufficiently high to serve as the III-N channel material, the sputtered material 128 may serve as a foundation or template for epitaxially growing the material 128 thereon, where the epitaxially grown material 128 will have a much better quality. Also, the sputtered material 128 that is used as a template for epitaxially growing the material 128 and then providing other components of the III-N transistor 102, may be the same material, e.g., deposited in a single deposition step, as the sputtered piezoelectric material provided between the bottom and top electrodes of the RF resonator 104, thus enabling integration of the III-N transistor 102 and the RF resonator 104 on a single substrate 108. FIG. 1A illustrates a first portion 146 being a portion of the sputtered material 128 that serves as a template for epitaxially growing the material 128 and then providing other components of the III-N transistor 102, and a second portion 148 being a portion of the sputtered material 128 that is included between the bottom and top electrodes of the RF resonator 104. While, in some embodiments, portions 146 and 148 may be made from the sputtered material 128 deposited in a single deposition step, descriptions provided herein are equally applicable to portions 146 and 148 being made from different sputtered piezoelectric III-N materials 128. In various embodiments, a thickness of the sputtered material 128 may be between about 100 and 2000 nanometers, including all values and ranges therein, while a thickness of the epitaxially grown material 126 may be between about 10 and 200 nanometers, e.g., between about 20 and 50 nanometers.

As also shown in FIG. 1A, the III-N transistor 102 may further, optionally, include the hard-mask material 132, which could include one or more of silicon nitride, carbon-doped silicon nitride, silicon oxide, or silicon oxynitride. In various embodiments, a thickness of the hard-mask material 132 may be between about 5 and 500 nanometers, including all values and ranges therein, e.g., between about 10 and 100 nanometers.

FIG. 1A further illustrates that, optionally, a portion 150 of an electrically conductive material may be provided between the sputtered portion 146 and the support structure 108. In some embodiments, the portion 150 may serve to dissipate heat generated by the transistor 102 because typically, electrically conductive materials also have high thermal conductivity. In such embodiments, the portion 150 may be coupled to a heat sink (not specifically shown in FIG. 1A), and not be electrically connected to any potential.

Although not specifically shown in FIG. 1A, the IC structure 100A may further include additional transistors similar to the III-N transistor 102, described above.

Turning now to the RF resonator 104, FIG. 1A illustrates that the resonator 104 may include a bottom electrode 152, a top electrode 154. In various embodiments, the bottom electrode 152 and the top electrode 154 may be of the same or different electrically conductive electrode material(s) 130, which materials may include any of the materials listed above with reference to the electrically conductive material 118.

Elements shown in FIG. 1A with reference numerals 156, 158, and 160 illustrate an example of how electrical connection to the bottom electrode 152 can be made. Electrical connection to the top electrode 154 can be made out of the plane of the drawing and, therefore, is not shown in FIG. 1A. Of course, in other embodiments, electrical connections to the electrodes 152, 154 can be arranged differently (the same holds for electrical connections to other electrically conductive materials shown in FIG. 1A, such as to S/D contacts 142).

In order to build an RF resonator, a piezoelectric material is sandwiched between the bottom electrode 152 and the top electrode 154, shown in FIG. 1A with the portion 148 of the sputtered material 128 being disposed between the bottom electrode 152 and the top electrode 154. Furthermore, in order to allow the piezoelectric portion 148 to vibrate, appropriate cavities are to be provided around the bottom and top electrodes 152 and 154, shown in FIG. 1A as cavities 162 and 164, respectively.

The thickness of the piezoelectric material portion 148 between the bottom and top electrodes 152, 154 of the resonator 104 may be inversely proportional to the resonance frequency of the resonator and may, therefore, be selected based on the desired cellular band for the operation of RF filter implementing such a resonator. For example, for a 2-4 gigahertz (GHz) cellular band, the thickness of the piezoelectric material portion 148 may be between about 1 and 2 micrometer (micron), while, for a 10-20 GHz band, the thickness of the piezoelectric material may be on the order of hundreds of nanometers, rather than micron. As described above, in some embodiments, the portion 148 could be made in a single sputtering process as the portion 146. In some such embodiments, the considerations for the desired cellular band operation of the RF resonator 104 may be decisive in selecting the thickness of these portions. In other embodiments when the portions 146 and 148 are made in a single sputtering process, thickness of the portion 148 may be further modified (e.g., reduced or increased) compared to the thickness of the portion 146.

Although not specifically shown in FIG. 1A, the IC structure 100A may further include additional resonators similar to the RF resonator 104, described above. In some embodiments, an RF filter may include a plurality of such resonators, all of which included on a single substrate in the modified version of the IC structure 100A (i.e., modified to include more resonators 104).

In various embodiments, the IC structure 100A may be included in, or used to implement at least a portion of an RF FE.

Figure 1B:
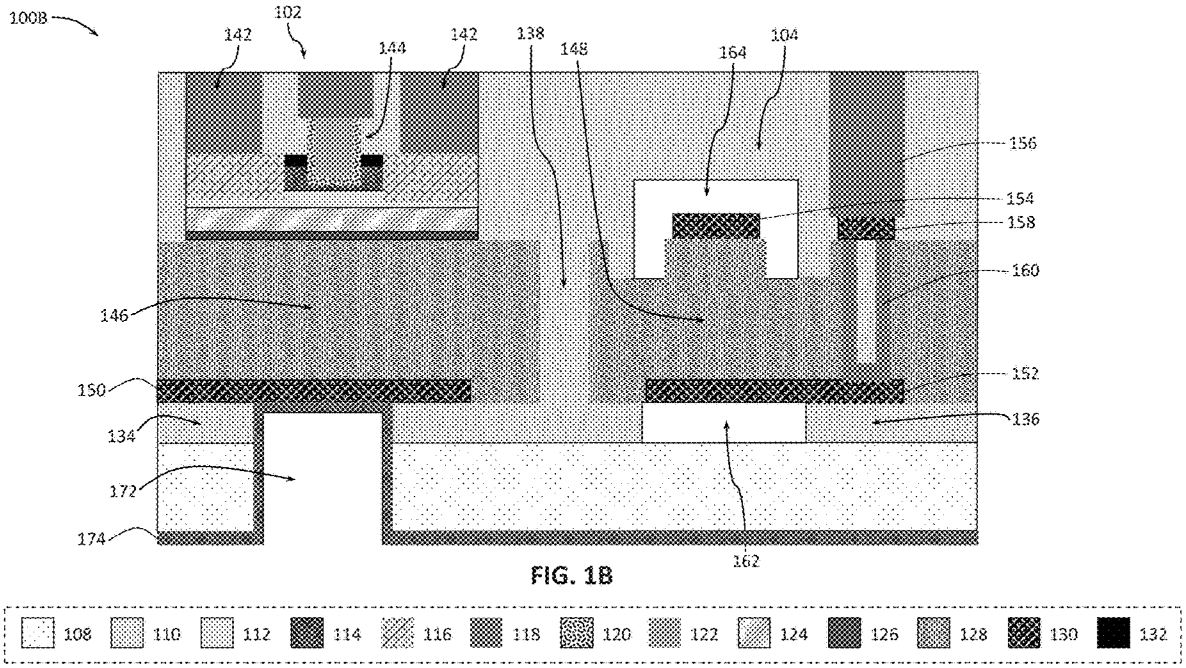
FIG. 1B provides a cross-sectional side view illustrating an IC structure that includes an III-N transistor with a backside thermal via, integrated with a resonator of an RF filter, according to some embodiments of the present disclosure.

FIG. 1B provides a cross-sectional side view illustrating an IC structure 100B that includes an III-N transistor integrated with a RF resonator, but now also including a backside thermal via 172, according to some embodiments of the present disclosure. The IC structure 100B is similar to the IC structure 100A and, therefore, descriptions provided for the IC structure 100A are applicable to the IC structure 100B and, in the interests of brevity, are not repeated here. Instead, only the differences are described. As shown in FIG. 1B, the backside thermal via 172 may be a vial lined with a thermally conductive material 174, and may be thermally coupled to the portion 150. Such an implementation may provide improved heat dissipation for the III-N transistor 102 and/or the IC structure 100B as a whole.

The IC structures illustrated in FIGS. 1A-1B do not represent an exhaustive set of assemblies in which one or more III-N transistors 102 may be integrated with one or more RF resonators 104 over a single substrate 108, as described herein, but merely provide examples of such structures/assemblies. Although particular arrangements of materials are discussed with reference to FIGS. 1A-1B, intermediate materials may be included in various portions of these figures. Note that FIGS. 1A-1B are intended to show relative arrangements of some of the components therein, and that various device components of these figures may include other components that are not specifically illustrated, e.g., various interfacial layers or various additional layers or elements. For example, although not specifically shown, the IC structures 100A-100B may include a solder resist material (e.g., polyimide or similar material) and one or more bond pads formed on upper-most interconnect layer of the IC structure, e.g., at the top of the IC structures 100A-100B. The bond pads may be electrically coupled with a further interconnect structure and configured to route the electrical signals between the III-N transistor 102 and other external devices, and/or between the RF resonator 104 and other external devices. For example, solder bonds may be formed on the one or more bond pads to mechanically and/or electrically couple a chip including the IC structures 100A-100B with another component (e.g., a circuit board). The IC structures 100A-100B may have other alternative configurations to route the electrical signals from the interconnect layers, e.g., the bond pads described above may be replaced by or may further include other analogous features (e.g., posts) that route the electrical signals to external components.

Additionally, although some elements of the IC structures are illustrated in FIGS. 1A-1B as being planar rectangles or formed of rectangular solids, this is simply for ease of illustration, and embodiments of various ones of these elements may be curved, rounded, or otherwise irregularly shaped as dictated by, and sometimes inevitable due to, the manufacturing processes used to fabricate semiconductor device assemblies. For example, while FIGS. 1A-1B may illustrate various elements, e.g., the S/D regions 116, the S/D contact regions 142, the portion 138, etc., as having perfectly straight sidewall profiles, i.e., profiles where the sidewalls extend perpendicularly to the support structure 108, these idealistic profiles may not always be achievable in real-world manufacturing processes. Namely, while designed to have straight sidewall profiles, real-world openings which may be formed as a part of fabricating various elements of the IC structures shown in FIGS. 1A-1B may end up having either so-called "re-entrant" profiles, where the width at the top of the opening is smaller than the width at the bottom of the opening, or "non-re-entrant" profile, where the width at the top of the opening is larger than the width at the bottom of the opening. Oftentimes, as a result of a real-world opening not having perfectly straight sidewalls, imperfections may form within the materials filling the opening. For example, typical for re-entrant profiles, a void may be formed in the center of the opening, where the growth of a given material filling the opening pinches off at the top of the opening. Therefore, descriptions of various embodiments of integrating one or more III-N transistors with one or more RF resonators provided herein are equally applicable to embodiments where various elements of such integrated structures look different from those shown in the figures due to manufacturing processes used to form them.

Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of the integration of one or more III-N transistors with one or more RF resonators as described herein.

Figure 2:
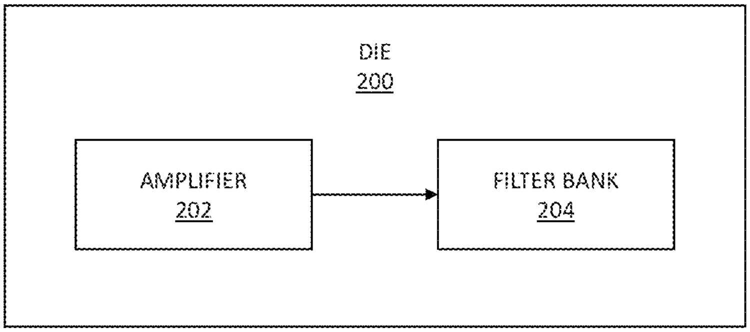
FIG. 2 provides a block diagram illustrating a die having a filter bank integrated with an amplifier, according to some embodiments of the present disclosure.

FIG. 2 provides a block diagram illustrating a die 200 having a filter bank 204 integrated with an amplifier 202, according to some embodiments of the present disclosure. The die 200 is one example implementation of the IC structures described herein, e.g., the IC structures 100A or 100B shown in FIGS. 1A-1B. The die 200 may be included in an RF FE component of an RF device (e.g., the RF device 2500 shown in FIG. 9), and may be included in a BS or in a UE device. RF FE components are important a BS and UE devices, especially in frequency division duplex (FDD) systems, and RF filters of such components may be substantial contributors to the die area and cost.

In particular, the die 200 may include the support structure 108 and the filter bank 204 may include a plurality of RF resonators, e.g., a plurality of RF resonators 104, described above. In some embodiments, at least some of the RF resonators 104 of the filter bank 204 may include lamb wave resonators (LWRs). A LWR is a relatively recent class of piezoelectric resonators, utilizing Lamb waves (i.e., elastic waves whose particle motion lies in the plane that contains the direction of wave propagation and the plate normal). In some embodiments, at least some of the RF resonators 104 of the filter bank 204 may include contour-mode resonators. Using a lateral filter type, e.g., by implementing the RF resonators of the filter bank 204 as LWRs or contour-mode resonators, may advantageously enable using a single mask set to generate different resonator frequencies. Although not specifically shown in FIG. 2, the filter bank 204 may further include, or be coupled to, a switch, configured to selectively switch any one of the plurality of RF resonators on and off (i.e., activate any one of the plurality of RF resonators), in order to achieve desired filtering characteristics of the filter bank 204 (i.e., in order to program the filter bank 204). For example, the filter bank 204 may be used to switch between different RF frequency ranges when the die 200 is a part of an RF device (e.g., the RF device 2500 shown in FIG. 9) included in a BS or in a UE device. In another example, the filter bank 204 may be programmable to suppress TX leakage on the different duplex distances.

In some embodiments, the amplifier 202 may include one or more III-N transistors such as the III-N transistor 102, described above. In some embodiments, the switch of the filter bank 204 may include one or more III-N transistors such as the III-N transistor 102, described above. In some embodiments, the amplifier 202 may be an LNA, when the die 200 is included in an RF receiver or an RF transceiver. In some embodiments, some RF resonators 104 of the filter bank 204 can be placed below active area (e.g., below biasing circuit) and inductor in LNA's drain can be re-used for filter matching, which may further reduce the size of the die 200. In some embodiments, the filter bank 204 may be placed after the LNA 202, in which case the Q factor of the RF filters of the filter bank 204 may be less critical (compared to conventional implementations of standalone RF filters), which may enable different tradeoffs in area and power consumption. Is some embodiments, one or more RF resonators 104 may also be included at the input to the amplifier 202.

Implementing RF filters of the filter bank 204 using RF resonators 104 integrated on a single die with one or more III-N transistors 102 employing filter centric III-N semiconductor films as described herein may allow decreasing complexity and cost of RF FE components and devices and increasing filtering flexibility. Integration of the filter bank 204 and the amplifier 202 on a single chip may reduce die area, cost, and improve performance by reducing RF losses due to integration. Furthermore, integration allows that the impedance between the amplifier 202 and the filter bank 204 does not necessarily need to be 50 Ohm (as was the case with some conventional implementations of stand-along filter banks), which may enable lower LNA current for required linearity specification.

Manufacturing III-N Transistors Integrated with RF Resonators

Figure 3:
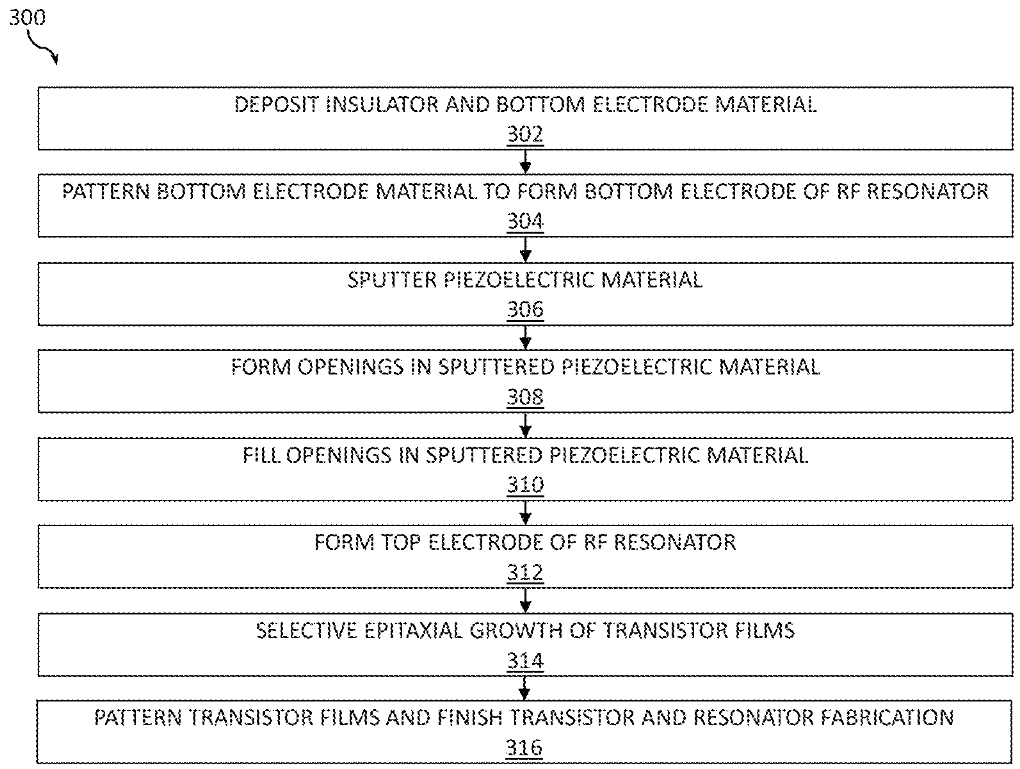
FIG. 3 is a flow diagram of an example method of manufacturing an IC structure that includes an III-N transistor integrated with a resonator of an RF filter, in accordance with various embodiments of the present disclosure.

The IC structures implementing one or more III-N transistors integrated with one or more RF resonators as described herein may be manufactured using any suitable techniques. Broadly, a method of manufacturing any of the IC structures described herein may include providing a piezoelectric material (e.g., the sputtered material 128) over a support structure (e.g., the support structure 108), providing an RF resonator (e.g., the resonator 104), where the RF resonator includes a first and a second electrodes (e.g., the electrodes 152 and 154), and a portion (e.g., the portion 148) of the piezoelectric material between the first and the second electrodes, and providing an III-N transistor (e.g., the transistor 102), where a portion (e.g., the portion 146) of the piezoelectric material is between the III-N transistor and the support structure. In such a method, processes for forming portions of an RF resonator may be interleaved, or at least partially concurrent, with processed for forming portions of an III-N transistor over the same substrate. One example of such a method is shown in FIG. 3. However, other examples of manufacturing any of the IC structures described herein, as well as larger devices and assemblies that include such structures (e.g., as shown in FIGS. 6-9) are also within the scope of the present disclosure.

FIG. 3 is a flow diagram of an example method 300 of manufacturing an IC structure that includes an III-N transistor integrated with an RF resonator, in accordance with various embodiments of the present disclosure.

Although the operations of the method 300 are illustrated once each and in a particular order, the operations may be performed in any suitable order and repeated as desired. For example, one or more operations may be performed in parallel to manufacture, substantially simultaneously, multiple III-N transistors and/or multiple RF resonators as described herein. In another example, the operations may be performed in a different order to reflect the structure of a particular device assembly in which one or more III-N transistors integrated with one or more RF resonators as described herein will be included.

In addition, the example manufacturing method 300 may include other operations not specifically shown in FIG. 3, such as various cleaning or planarization operations as known in the art. For example, in some embodiments, the support structure 108, as well as layers of various other materials subsequently deposited thereon, may be cleaned prior to, after, or during any of the processes of the method 300 described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the structures/assemblies described herein may be planarized prior to, after, or during any of the processes of the method 300 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

Various operations of the method 300 may be illustrated with reference to the example embodiments shown in FIGS. 4A-4G, illustrating fabrication of an IC structure as shown in FIG. 1A, but the method 300 may be used to manufacture any suitable IC structures having one or more III-N transistors integrated with one or more RF resonators according to any embodiments of the present disclosure. FIGS. 4A-4G illustrate cross-sectional side views similar to the view shown in FIG. 1A, in various example stages in the manufacture of an IC structure using the method of FIG. 3 in accordance with some embodiments of the present disclosure.

The method 300 may begin with providing a layer of an insulator material over a substrate, and further providing a layer of a bottom electrode material over the insulator material (process 302 shown in FIG. 3, a result of which is illustrated with an IC structure 402 shown in FIG. 4A). The IC structure 402 illustrates the support structure 108 and a layer of the insulator 110 provided thereon, and further illustrates a layer of the electrically conductive material 130 provided over the insulator 110. The layers may include materials and have thicknesses as described above with reference to these portions of the IC structure 100A. In various embodiments, any suitable deposition techniques may be used to deposit and a layer of the insulator 110 and a layer of the bottom electrode material 130. Examples of deposition techniques that may be used to provide a layer of the insulator 110 include, but are not limited to, spin-coating, dip-coating, atomic layer deposition (ALD), physical vapor deposition (PVD) (e.g., evaporative deposition, magnetron sputtering, or e-beam deposition), or CVD. Examples of deposition techniques that may be used to provide a layer of the bottom electrode material 130 include, but are not limited to, ALD, PVD (including sputtering), CVD, or electroplating.

Figure 4B:
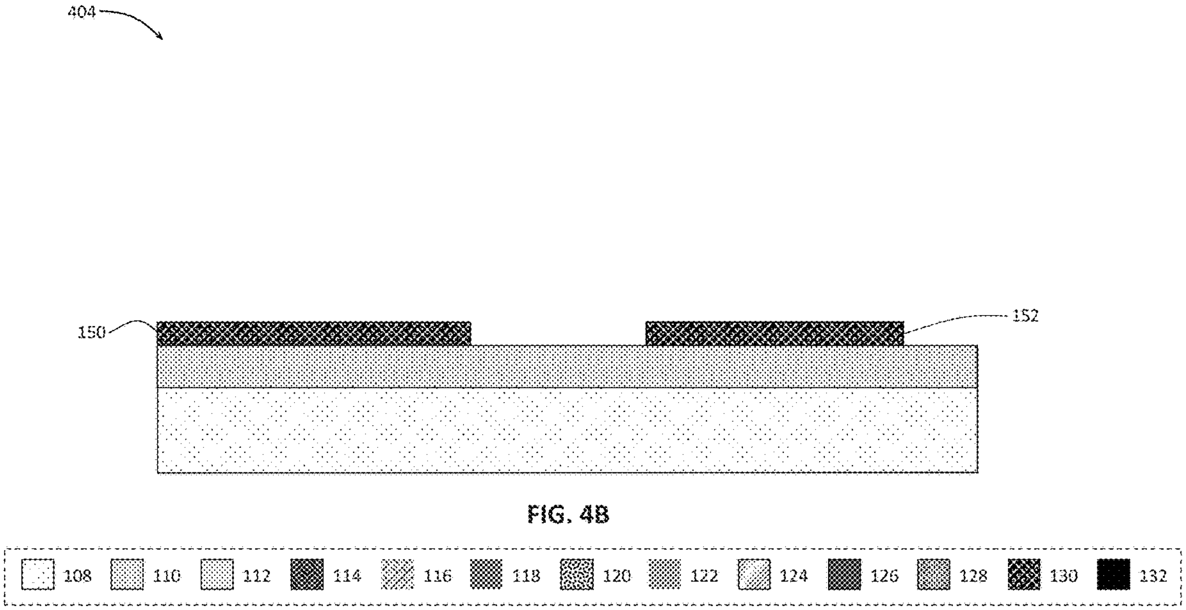

The method 300 may then proceed with patterning the bottom electrode layer deposited in 302 to form one or more bottom electrodes (process 304 shown in FIG. 3, a result of which is illustrated with an IC structure 404 shown in FIG. 4B). The IC structure 404 illustrates that the layer of the bottom electrode material 130 is patterned to form the bottom electrode 152 for the future RF resonator, as well as the portion 150 to be below the future III-N transistor, as described above. In various embodiments, any suitable patterning techniques may be used in the process 304, such as, but not limited to, photolithographic or electron-beam (e-beam) patterning, possibly in conjunction with a suitable etching technique, e.g., a dry etch, such as RF reactive ion etch (RIE) or inductively coupled plasma (ICP) RIE. In some embodiments, the etch performed in the process 304 may include an anisotropic etch, using etchants in a form of e.g., chemically active ionized gas (i.e., plasma) using e.g., bromine (Br) and chloride (Cl) based chemistries. In some embodiments, during the etch of the process 304, the IC structure may be heated to elevated temperatures, e.g., to temperatures between about room temperature and 200 degrees Celsius, including all values and ranges therein, to promote that byproducts of the etch are made sufficiently volatile to be removed from the surface.

Figure 4C:
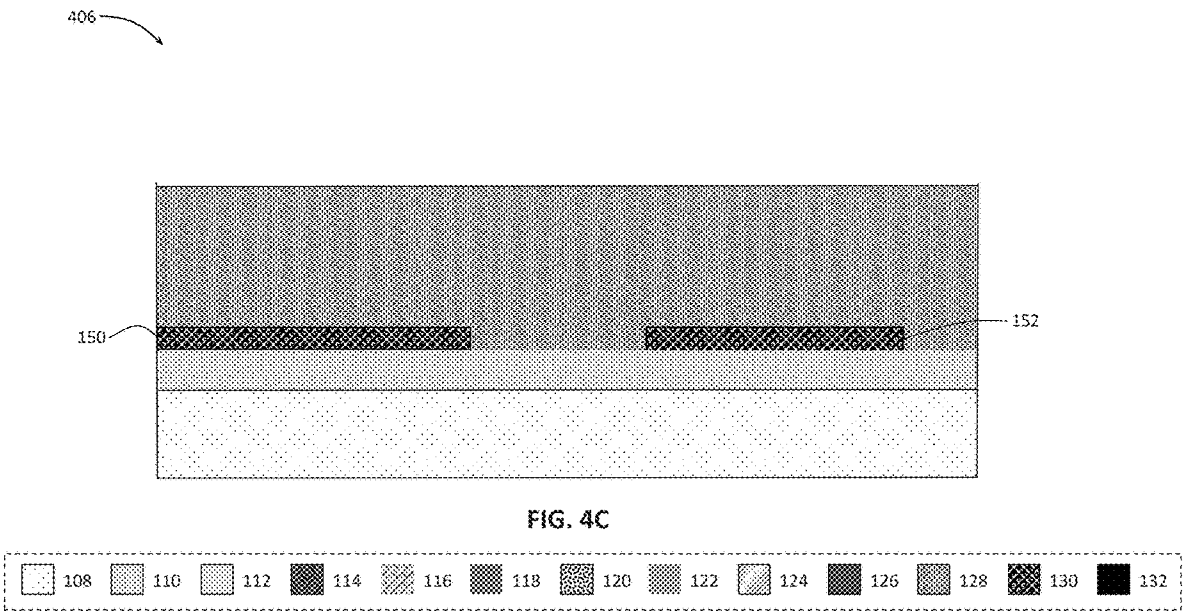

Next, the method 300 may include sputtering a layer of a piezoelectric material, e.g., an III-N material, over the one or more bottom electrodes formed in the process 304 (process 306 shown in FIG. 3, a result of which is illustrated with an IC structure 406 shown in FIG. 4C). The IC structure 406 illustrates a layer of the sputtered material 128 provided over the bottom electrode 152 and the portion 150. The layer deposited in process 306 may include materials and have thicknesses as described above with reference to the sputtered material 128.

Figure 4D:
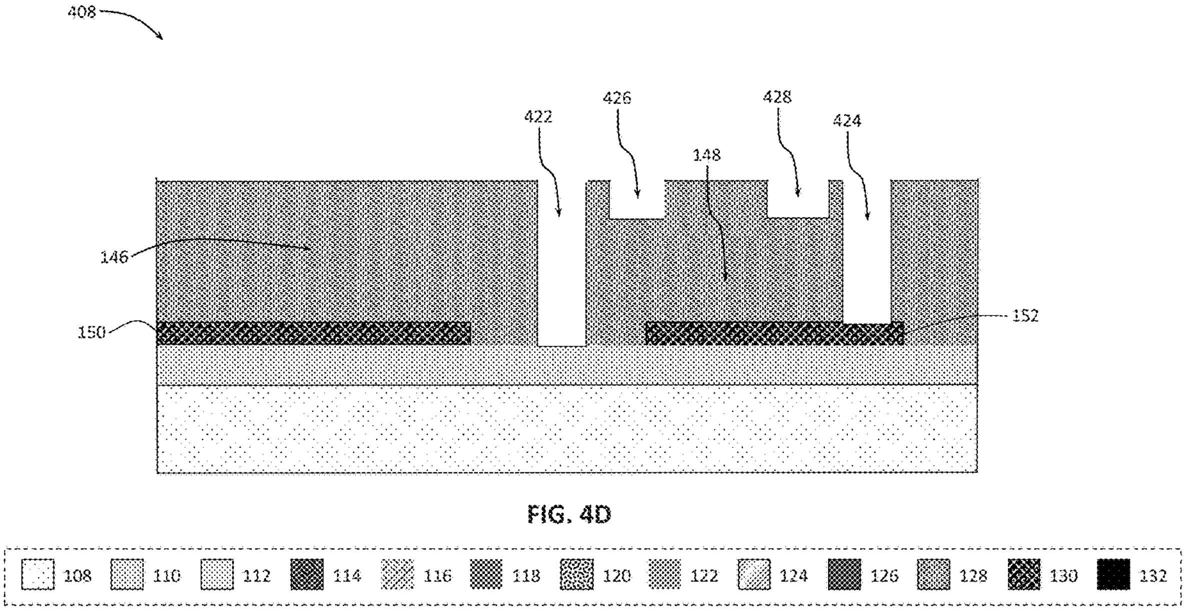

The method 300 may then proceed with forming one or more openings in the layer of the sputtered material 128 provided in process 306 (process 308 shown in FIG. 3, a result of which is illustrated with an IC structure 408 shown in FIG. 4D). The IC structure 408 illustrates an opening 422 (which may be referred to as a "deep isolation trench") for electrically isolating the III-N transistor 102 from the RF resonator 104. The IC structure 408 further illustrates an opening 424 (which may be referred to as a "deep trench") for providing electrical contact to the bottom electrode 152 of the RF resonator 104. Still further, the IC structure 408 illustrates openings 426 and 428 (which may be referred to as "shallow trenches") for forming a portion 430 of the sputtered material 128 that protrudes from the adjacent portions (the ones at the bottom of the openings 426 and 428) for housing the top electrode 154 thereon, provided at a later process. In various embodiments, any suitable techniques may be used for forming the openings in the process 308, e.g., patterning and etching techniques described above with reference to the process 304.

The method 300 may then proceed with filling the openings formed in the process 308 with desired materials (process 310 shown in FIG. 3, a result of which is illustrated with an IC structure 410 shown in FIG. 4E). The IC structure 410 illustrates that the opening 422 is filled with the insulator 110, so that the portion 138 of the insulator 110 provides electrical isolation between the sputtered material portion 146 under the III-N transistor 102 and the sputtered material portion 148 under the RF resonator 104. The IC structure 410 further illustrates that the openings 426 and 428 are also filled with the insulator 110. Further, the IC structure 410 illustrates that the opening 424 is lined with a layer of an electrically conductive material, e.g., tungsten, titanium nitride, tantalum nitride, titanium, or any of the electrically conductive materials described with reference to the material 118, and then filled with the insulator 110. In some embodiments, lining of the opening 424 with an electrically conductive material may be performed using any suitable conformal deposition technique, e.g., using CVD or ALD. In other embodiments, the opening 424 may be lined with an electrically conductive material, but the remainder of the opening 424 does not have to be filled with any materials and may be left void. In still other embodiments, the opening 424 may be completely filled with the electrically conductive material instead of only being lined with said material. The insulator 110 may be deposited in the process 310 using any of the deposition techniques described above with reference to the process 302.

Further, the method 300 may proceed with forming a top electrode for the future RF resonator 104 (process 312 shown in FIG. 3, a result of which is illustrated with an IC structure 412 shown in FIG. 4F). The IC structure 412 illustrates the top electrode 154 and an electrically conductive element 158 formed from the electrode material 130. In various embodiments, any suitable deposition and patterning techniques may be used in the process 312, such as, but not limited to, those described with reference to the processes 302 and 304 for forming the bottom electrode 152.

The method 300 may proceed with epitaxially growing various transistor films for forming the future III-N transistor 102 (process 314 shown in FIG. 3, a result of which is illustrated with an IC structure 414 shown in FIG. 4G). In this context, "epitaxial growth" refers to the deposition of crystalline overlayers in the form of the desired materials on the surface of the sputtered piezoelectric material 128 which provides an ordered template for the growth. The epitaxial growth of various layers of the process 314 may be carried out using any known gaseous or liquid precursors for forming the desired material layers. The IC structure 414 illustrates a layer of the epitaxially grown piezoelectric material 126 grown over the upper surface of the sputtered piezoelectric material 128, a layer of the buffer material 124 provided over the epitaxially grown piezoelectric material 126 (the buffer layer material may also be epitaxially grown), a layer of the III-N channel material 112 over the buffer layer material 124, a layer of the polarization material 114 over the III-N channel material 112, and a layer of the hard-mask material 132 (e.g., SiN). The layers deposited in the process 314 may include materials and have thicknesses as described above with reference to these portions of the IC structure 100A.

The method 300 may conclude with patterning the transistor films deposited in the process 314 and finishing transistor and resonator fabrication to form an IC structure having an III-N transistor integrated with an RF resonator as described herein (process 316 shown in FIG. 3, a result of which is not illustrated in FIG. 4 because the result could be, e.g., the IC structure 100A shown in FIG. 1A or the IC structure 100B shown in FIG. 1B). The process 314 may include providing S/D regions, S/D contacts, a gate stack, etc., to arrive at the desired IC structure.

The S/D regions 116 may be formed using an implantation/diffusion process or an etching/deposition process, for example. In the former process, dopants such as silicon, germanium (where silicon and germanium are N-type dopants for III-N materials), boron, aluminum, antimony, phosphorous, or arsenic may be ion-implanted into the stack of the hard-mask material 132, the polarization material 114, and the III-N channel material 112 to form the S/D regions 116. An annealing process that activates the dopants and causes them to diffuse farther into the stack of the hard-mask material 132, the polarization material 114, and the III-N channel material 112 may follow the ion-implantation process. In the latter process, the stack of the hard-mask material 132, the polarization material 114, and the III-N channel material 112 may first be etched to form recesses at the locations of the S/D regions 116. An epitaxial deposition process may then be carried out to fill the recesses with material that is used to fabricate the S/D regions 116. In some implementations, the S/D regions 116 may be fabricated using an III-V alloy such as indium gallium nitride and gallium nitride. In some embodiments, the epitaxially deposited III-V alloy may be doped in situ with dopants such as silicon, germanium, boron, arsenic, or phosphorous. In some embodiments, the S/D regions 116 may be formed using one or more alternate semiconductor materials such as germanium or a group III-V material or alloy. In further embodiments, one or more layers of metal and/or metal alloys may be used to form the S/D regions 116. Example structures and devices with III-N transistors integrated with RF resonators IC structures that include one or more III-N transistors integrated with one or more resonators of RF filters as disclosed herein may be included in any suitable electronic device. FIGS. 5-9 illustrate various examples of devices and components that may include one or more III-N transistors integrated with one or more RF resonators as disclosed herein.

Figure 5A:
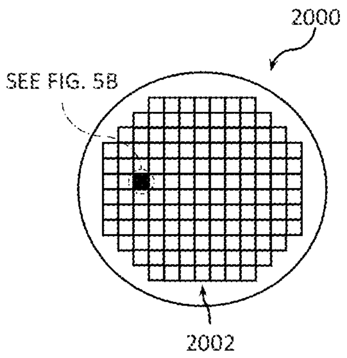
FIGS. 5A-5B are top views of a wafer and dies that include one or more IC structures having III-N transistors integrated with resonators of RF filters in accordance with any of the embodiments of the present disclosure.
Figure 5B:
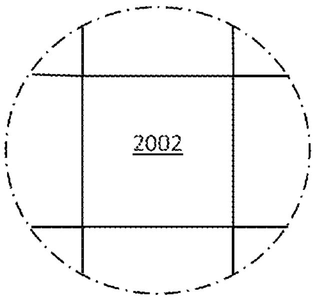

FIGS. 5A-5B are top views of a wafer 2000 and dies 2002 that may include one or more III-N transistors integrated with one or more RF resonators in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 6. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more III-N transistors integrated with one or more RF resonators as described herein). After the fabrication of the semiconductor product is complete (e.g., after manufacture of one or more III-N transistors integrated with one or more RF resonators as described herein, e.g., after manufacture of any embodiment of the IC structures 100A or 100B), the wafer 2000 may undergo a singulation process in which each of the dies 2002 is separated from one another to provide discrete "chips" of the semiconductor product. In particular, devices that include one or more III-N transistors integrated with one or more RF resonators as disclosed herein may take the form of the wafer 2000 (e.g., not singulated) or the form of the die 2002 (e.g., singulated). The die 2002 may include one or more transistors (e.g., one or more III-N transistors 102 as described herein), one or more resonators (e.g., one or more RF resonators 104 as described herein) as well as, optionally, supporting circuitry to route electrical signals to the III-N transistors and RF resonators, as well as any other IC components. In some embodiments, the wafer 2000 or the die 2002 may implement an RF FE device, a memory device (e.g., a SRAM device), a logic device (e.g., an AND, OR, NAND, or NOR gate), or any other suitable circuit element. Multiple ones of these devices may be combined on a single die 2002. For example, an RF filter array formed by multiple RF resonators may be formed on a same die 2002.

Figure 6:
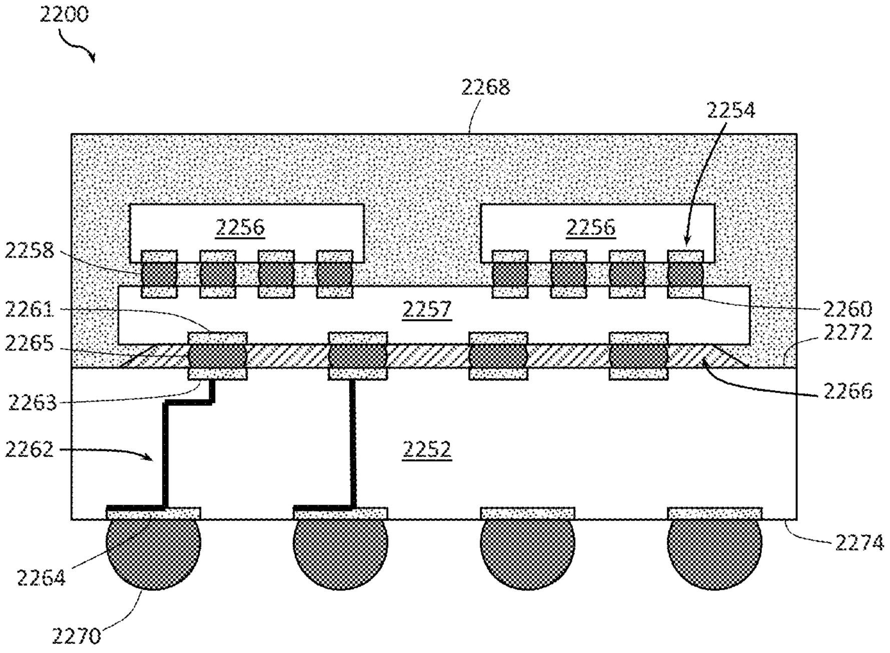
FIG. 6 is a cross-sectional side view of an IC package that may include one or more IC structures having III-N transistors integrated with resonators of RF filters in accordance with any of the embodiments of the present disclosure.

FIG. 6 is a side, cross-sectional view of an example IC package 2200 that may include one or more IC structures having one or more III-N transistors integrated with one or more RF resonators in accordance with any of the embodiments disclosed herein. In some embodiments, the IC package 2200 may be a system-in-package (SiP).

As shown in FIG. 6, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 6 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 6 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268.

Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 6 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 7.

The dies 2256 may take the form of any of the embodiments of the die 2002 discussed herein and may include any of the embodiments of an IC structure having one or more III-N transistors integrated with one or more RF resonators, e.g., any of the IC structures 100A or 100B. In embodiments in which the IC package 2200 includes multiple dies 2256, the IC package 2200 may be referred to as a multi-chip package (MCP). Importantly, even in such embodiments of an MCP implementation of the IC package 2200, one or more III-N transistors integrated with one or more RF resonators in a single chip, in accordance with any of the embodiments described herein. The dies 2256 may include circuitry to perform any desired functionality. For example, one or more of the dies 2256 may be RF FE dies, including one or more III-N transistors integrated with one or more RF resonators in a single die as described herein, one or more of the dies 2256 may be logic dies (e.g., silicon-based dies), one or more of the dies 2256 may be memory dies (e.g., high bandwidth memory), etc. In some embodiments, any of the dies 2256 may include one or more III-N transistors integrated with one or more RF resonators, e.g., as discussed above; in some embodiments, at least some of the dies 2256 may not include any III-N transistors integrated with RF resonators.

The IC package 2200 illustrated in FIG. 6 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 6, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 7:
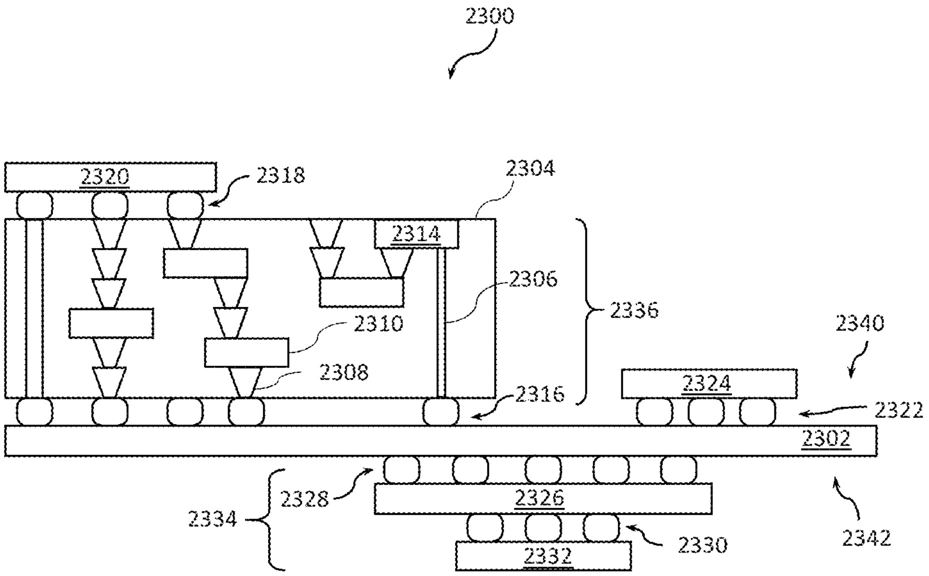
FIG. 7 is a cross-sectional side view of an IC device assembly that may include one or more IC structures having III-N transistors integrated with resonators of RF filters in accordance with any of the embodiments of the present disclosure.

FIG. 7 is a cross-sectional side view of an IC device assembly 2300 that may include components having one or more IC structures implementing one or more III-N transistors integrated with one or more RF resonators in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC structures implementing one or more III-N transistors integrated with one or more RF resonators in accordance with any of the embodiments disclosed herein; e.g., any of the IC packages discussed below with reference to the IC device assembly 2300 may take the form of any of the embodiments of the IC package 2200 discussed above with reference to FIG. 6 (e.g., may include one or more III-N transistors integrated with one or more RF resonators in/on a die 2256).

In some embodiments, the circuit board 2302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 7 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 7), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 5B), an IC device (e.g., the IC structure of FIGS. 1A-1B), or any other suitable component. In particular, the IC package 2320 may include one or more III-N transistors integrated with one or more RF resonators as described herein. Although a single IC package 2320 is shown in FIG. 7, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 7, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as further RF devices, PAs, power management devices, antennas, arrays, sensors, and microelectromechanical systems (MEMS) devices may also be formed on the interposer 2304. In some embodiments, the IC structures implementing one or more III-N transistors integrated with one or more RF resonators as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 7 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 8:
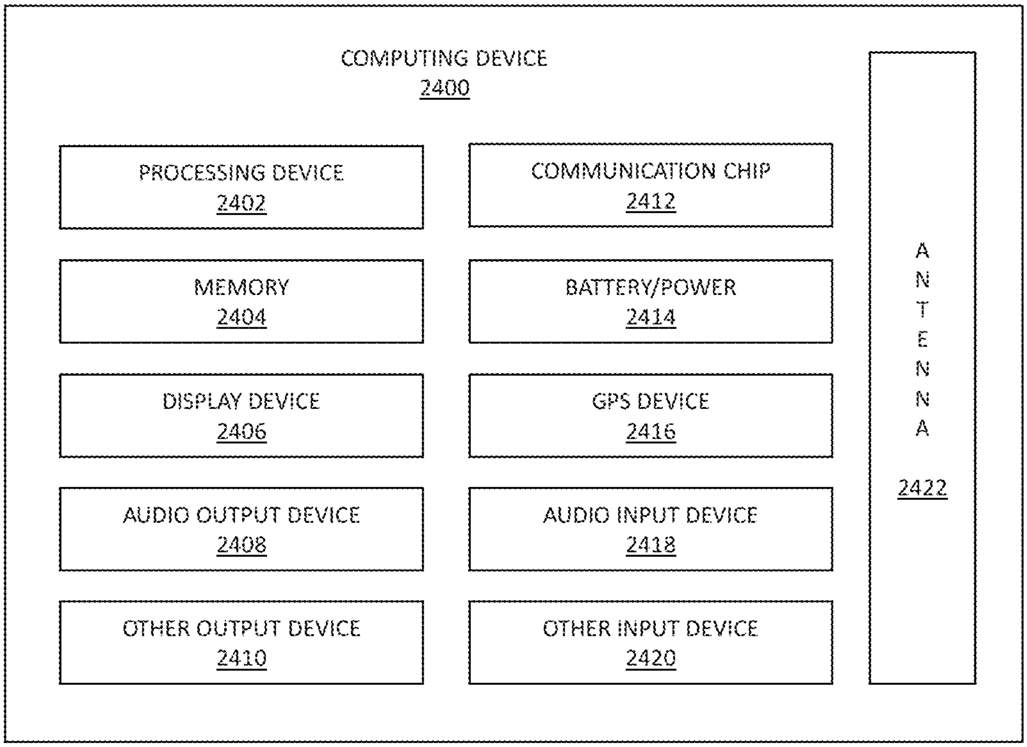
FIG. 8 is a block diagram of an example computing device that may include one or more IC structures having III-N transistors integrated with resonators of RF filters in accordance with any of the embodiments of the present disclosure.

FIG. 8 is a block diagram of an example computing device 2400 that may include one or more components with one or more IC structures having one or more III-N transistors integrated with one or more RF resonators in accordance with any of the embodiments disclosed herein. For example, any suitable ones of the components of the computing device 2400 may include a die (e.g., the die 2002 (FIG. 5B)) including one or more III-N transistors integrated with one or more RF resonators in accordance with any of the embodiments disclosed herein. Any of the components of the computing device 2400 may include an IC device (e.g., the IC structure of FIGS. 1A-1B) and/or an IC package 2200 (FIG. 6). Any of the components of the computing device 2400 may include an IC device assembly 2300 (FIG. 7).

A number of components are illustrated in FIG. 8 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 8, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-M RAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC structures as described herein may be particularly advantageous for use within the one or more communication chips 2412, described above. For example, such IC structures may be used to implement one or more of PAs, LNAs, filters (including arrays of filters and filter banks), switches, upconverters, downconverters, and duplexers, e.g., as a part of implementing an RF transmitter, an RF receiver, or an RF transceiver.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Figure 9:
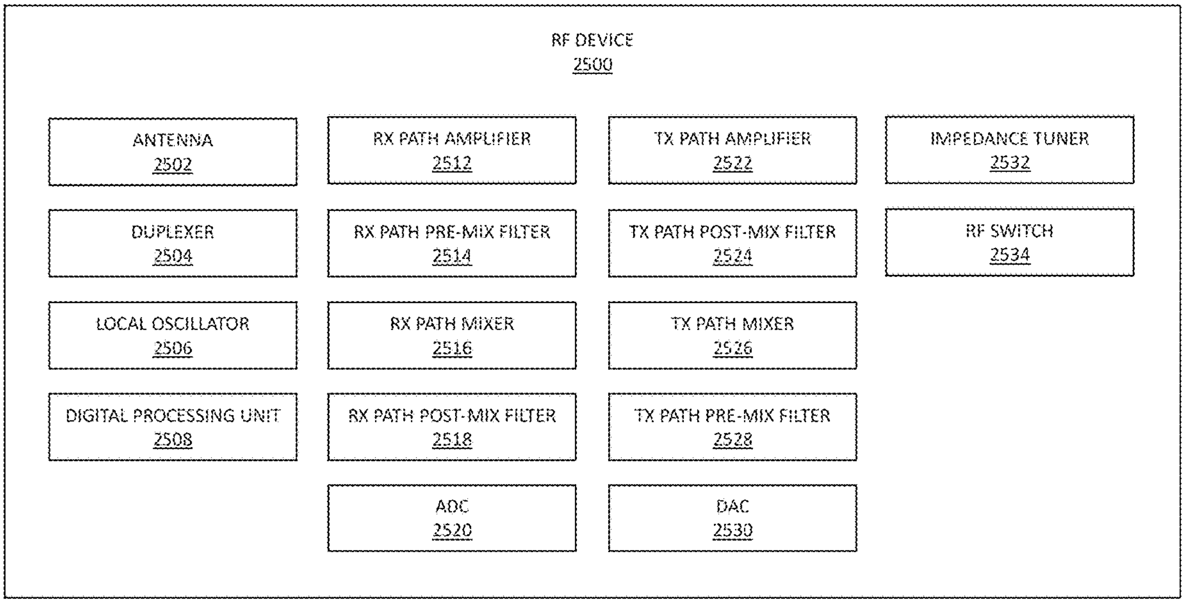
FIG. 9 is a block diagram of an example RF device that may include one or more IC structures having III-N transistors integrated with resonators of RF filters in accordance with any of the embodiments of the present disclosure.

FIG. 9 is a block diagram of an example RF device 2500 that may include one or more components with one or more IC structures having one or more III-N transistors integrated with one or more RF resonators in accordance with any of the embodiments disclosed herein. For example, any suitable ones of the components of the RF device 2500 may include a die (e.g., the die 2002 as described with reference to FIG. 5 or the die 200 as described with reference to FIG. 2) including one or more III-N transistors integrated with one or more RF resonators in accordance with any of the embodiments disclosed herein. Any of the components of the RF device 2500 may include an IC device (e.g., the IC structure of FIGS. 1A-1B) and/or an IC package 2200 as described with reference to FIG. 6. Any of the components of the RF device 2500 may include an IC device assembly 2300 as described with reference to FIG. 7. In some embodiments, the RF device 2500 may be included within any components of the computing device 2400 as described with reference to FIG. 8, or may be coupled to any of the components of the computing device 2400, e.g., be coupled to the memory 2404 and/or to the processing device 2402 of the computing device 2400. In still other embodiments, the RF device 2500 may further include any of the components described with reference to FIG. 8, such as, but not limited to, the battery/power circuit 2414, the memory 2404, and various input and output devices as shown in FIG. 8.

In general, the RF device 2500 may be any device or system that may transmit and/or receive signals in the form of electromagnetic waves in the RF range of approximately 3 kiloHertz (kHz) to 300 gigaHertz (GHz). In some embodiments, the RF device 2500 may be used for wireless communications, e.g., in a BS or a UE device of any suitable cellular wireless communications technology, such as GSM, WCDMA, or LTE. In a further example, the RF device 2500 may be used as, or in, e.g., a BS or a UE device of a mm-wave wireless technology such as fifth generation (5G) wireless (i.e., high frequency/short wavelength spectrum, e.g., with frequencies in the range between about 20 and 60 GHz, corresponding to wavelengths in the range between about 5 and 15 millimeters). In yet another example, the RF device 2500 may be used for wireless communications using WiFi technology (e.g., a frequency band of 2.4 GHz, corresponding to a wavelength of about 12 cm, or a frequency band of 5.8 GHz, spectrum, corresponding to a wavelength of about 5 cm), e.g., in a WiFi-enabled device such as a desktop, a laptop, a video game console, a smart phone, a tablet, a smart TV, a digital audio player, a car, a printer, etc. In some implementations, a WiFi-enabled device may, e.g., be a node in a smart system configured to communicate data with other nodes, e.g., a smart sensor. Still in another example, the RF device 2500 may be used for wireless communications using Bluetooth technology (e.g., a frequency band from about 2.4 to about 2.485 GHz). In other embodiments, the RF device 2500 may be used for transmitting and/or receiving RF signals for purposes other than communication, e.g., in an automotive radar system, or in medical applications such as magneto-resonance imaging (MRI).

In various embodiments, the RF device 2500 may be included in FDD or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

A number of components are illustrated in FIG. 9 as included in the RF device 2500, but any one or more of these components may be omitted or duplicated, as suitable for the application. For example, in some embodiments, the RF device 2500 may be an RF transceiver, in which case it may include both the components of what is referred to herein as a transmit (TX) path and the components of what is referred to herein as a receive (RX) path. However, in other embodiments, the RF device 2500 may be an RF receiver, in which case it may include the components of the RX path, but not the components of the TX path; or the RF device 2500 may be an RF transmitter, in which case it may include the components of the TX path, but not the components of the RX path.

In some embodiments, some or all of the components included in the RF device 2500 may be attached to one or more motherboards. In some embodiments, some or all of these components are fabricated on a single die, e.g., on a single SoC die.

Additionally, in various embodiments, the RF device 2500 may not include one or more of the components illustrated in FIG. 9, but the RF device 2500 may include interface circuitry for coupling to the one or more components. For example, the RF device 2500 may not include an antenna 2502, but may include antenna interface circuitry (e.g., a matching circuitry, a connector and driver circuitry) to which an antenna 2502 may be coupled. In another set of examples, the RF device 2500 may not include a digital processing unit 2508 or a local oscillator 2506, but may include device interface circuitry (e.g., connectors and supporting circuitry) to which a digital processing unit 2508 or a local oscillator 2506 may be coupled.

As shown in FIG. 9, the RF device 2500 may include an antenna 2502, a duplexer 2504, a local oscillator 2506, a digital processing unit 2508. As also shown in FIG. 9, the RF device 2500 may include an RX path which may include an RX path amplifier 2512, an RX path pre-mix filter 2514, a RX path mixer 2516, an RX path post-mix filter 2518, and an analog-to-digital converter (ADC) 2520. As further shown in FIG. 9, the RF device 2500 may include a TX path which may include a TX path amplifier 2522, a TX path post-mix filter 2524, a TX path mixer 2526, a TX path pre-mix filter 2528, and a digital-to-analog converter (DAC) 2530. Still further, the RF device 2500 may further include an impedance tuner 2532 and an RF switch 2534. In various embodiments, the RF device 2500 may include multiple instances of any of the components shown in FIG. 9.

The antenna 2502 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2500 is an FDD transceiver, the antenna 2502 may be configured for concurrent reception and transmission of communication signals in separate, i.e., non-overlapping and non-continuous, bands of frequencies, e.g. in bands having a separation of, e.g., 20 MHz from one another. If the RF device 2500 is a TDD transceiver, the antenna 2502 may be configured for sequential reception and transmission of communication signals in bands of frequencies which may be the same, or overlapping for TX and RX paths. In some embodiments, the RF device 2500 may be a multi-band RF device, in which case the antenna 2502 may be configured for concurrent reception of signals having multiple RF components in separate frequency bands and/or configured for concurrent transmission of signals having multiple RF components in separate frequency bands. In such embodiments, the antenna 2502 may be a single wide-band antenna or a plurality of band-specific antennas (i.e., a plurality of antennas each configured to receive and/or transmit signals in a specific band of frequencies). In various embodiments, the antenna 2502 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2500 may include more than one antenna 2502 to implement antenna diversity. In some such embodiments, the RF switch 2534 may be deployed to switch between different antennas.

An output of the antenna 2502 may be coupled to the input of the duplexer 2504. The duplexer 2504 may be any suitable component configured for filtering multiple signals to allow for bidirectional communication over a single path between the duplexer 2504 and the antenna 2502. The duplexer 2504 may be configured for providing RX signals to the RX path of the RF device 2500 and for receiving TX signals from the TX path of the RF device 2500.

The RF device 2500 may include one or more local oscillators 2506, configured to provide local oscillator signals which may be used for downconversion of the RF signals received by the antenna 2502 and/or upconversion of the signals to be transmitted by the antenna 2502.

The RF device 2500 may include the digital processing unit 2508, which may include one or more processing devices. In some embodiments, the digital processing unit 2508 may be implemented as the processing device 2402 shown in FIG. 8, descriptions of which are provided above (when used as the digital processing unit 2508, the processing device 2402 may, but does not have to, implement any of the IC structures as described herein, e.g., IC structures having one or more RF resonators integrated with one or more III-N transistors in accordance with any of the embodiments disclosed herein). The digital processing unit 2508 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 9, in some embodiments, the RF device 2500 may further include a memory device, e.g., the memory device 2404 as described with reference to FIG. 8, configured to cooperate with the digital processing unit 2508. When used within, or coupled to, the RF device 2500, the memory device 2404 may, but does not have to, implement any of the IC structures as described herein, e.g., IC structures having one or more RF resonators integrated with one or more III-N transistors in accordance with any of the embodiments disclosed herein.

Turning to the details of the RX path that may be included in the RF device 2500, the RX path amplifier 2512 may include an LNA. An input of the RX path amplifier 2512 may be coupled to an antenna port (not shown) of the antenna 2502, e.g., via the duplexer 2504. The RX path amplifier 2512 may amplify the RF signals received by the antenna 2502.

An output of the RX path amplifier 2512 may be coupled to an input of the RX path pre-mix filter 2514, which may be a harmonic or band-pass filter, configured to filter received RF signals that have been amplified by the RX path amplifier 2512.

An output of the RX path pre-mix filter 2514 may be coupled to an input of the RX path mixer 2516, also referred to as a downconverter. The RX path mixer 2516 may include two inputs and one output. A first input may be configured to receive the RX signals, which may be current signals, indicative of the signals received by the antenna 2502 (e.g., the first input may receive the output of the RX path pre-mix filter 2514). A second input may be configured to receive local oscillator signals from one of the local oscillators 2506. The RX path mixer 2516 may then mix the signals received at its two inputs to generate a downconverted RX signal, provided at an output of the RX path mixer 2516. As used herein, downconversion refers to a process of mixing a received RF signal with a local oscillator signal to generate a signal of a lower frequency. In particular, the downconverter 2516 may be configured to generate the sum and/or the difference frequency at the output port when two input frequencies are provided at the two input ports. In some embodiments, the RF device 2500 may implement a direct-conversion receiver (DCR), also known as homodyne, synchrodyne, or zero-IF receiver, in which case the RX path mixer 2516 may be configured to demodulate the incoming radio signals using local oscillator signals whose frequency is identical to, or very close to the carrier frequency of the radio signal. In other embodiments, the RF device 2500 may make use of downconversion to an intermediate frequency (IF). IFs may be used in superheterodyne radio receivers, in which a received RF signal is shifted to an IF, before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2516 may include several such stages of IF conversion.

Although a single RX path mixer 2516 is shown in the RX path of FIG. 9, in some embodiments, the RX path mixer 2516 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2502 and an in-phase component of the local oscillator signal provided by the local oscillator 2506. The second RX path mixer may be configured for performing downconversion to generate a quadrature (Q) downconverted RX signal by mixing the RX signal received by the antenna 2502 and a quadrature component of the local oscillator signal provided by the local oscillator 2506 (the quadrature component is a component that is offset in phase from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2516 may, optionally, be coupled to the RX path post-mix filter 2518, which may be low-pass filters. In case the RX path mixer 2516 is a quadrature mixer that implements the first and second mixers as described above, the in-phase and quadrature components provided at the outputs of the first and second mixers respectively may be coupled to respective individual first and second RX path post-mix filters included in the filter 2518.

The ADC 2520 may be configured to convert the mixed RX signals from the RX path mixer 2516 from analog to digital domain. The ADC 2520 may be a quadrature ADC that, similar to the RX path quadrature mixer 2516, may include two ADCs, configured to digitize the downconverted RX path signals separated in in-phase and quadrature components. The output of the ADC 2520 may be provided to the digital processing unit 2508, configured to perform various functions related to digital processing of the RX signals so that information encoded in the RX signals can be extracted.

Turning to the details of the TX path that may be included in the RF device 2500, the digital signal to later be transmitted (TX signal) by the antenna 2502 may be provided, from the digital processing unit 2508, to the DAC 2530. Similar to the ADC 2520, the DAC 2530 may include two DACs, configured to convert, respectively, digital I- and Q-path TX signal components to analog form.

Optionally, the output of the DAC 2530 may be coupled to the TX path pre-mix filter 2528, which may be a band-pass filter (or a pair of band-pass filters, in case of quadrature processing) configured to filter out, from the analog TX signals output by the DAC 2530, the signal components outside of the desired band. The digital TX signals may then be provided to the TX path mixer 2526, which may also be referred to as an upconverter. Similar to the RX path mixer 2516, the TX path mixer 2526 may include a pair of TX path mixers, for in-phase and quadrature component mixing. Similar to the first and second RX path mixers that may be included in the RX path, each of the TX path mixers of the TX path mixer 2526 may include two inputs and one output. A first input may receive the TX signal components, converted to the analog form by the respective DAC 2530, which are to be upconverted to generate RF signals to be transmitted. The first TX path mixer may generate an in-phase (I) upconverted signal by mixing the TX signal component converted to analog form by the DAC 2530 with the in-phase component of the TX path local oscillator signal provided from the local oscillator 2506 (in various embodiments, the local oscillator 2506 may include a plurality of different local oscillators, or be configured to provide different local oscillator frequencies for the mixer 2516 in the RX path and the mixer 2526 in the TX path). The second TX path mixer may generate a quadrature phase (Q) upconverted signal by mixing the TX signal component converted to analog form by the DAC 2530 with the quadrature component of the TX path local oscillator signal. The output of the second TX path mixer may be added to the output of the first TX path mixer to create a real RF signal. A second input of each of the TX path mixers may be coupled the local oscillator 2506.

Optionally, the RF device 2500 may include the TX path post-mix filter 2524, configured to filter the output of the TX path mixer 2526.

The TX path amplifier 2522 may be a PA, configured to amplify the upconverted RF signal before providing it to the antenna 2502 for transmission.

In various embodiments, any of the RX path pre-mix filter 2514, the RX path post-mix filter 2518, the TX post-mix filter 2524, and the TX pre-mix filter 2528 may be implemented as RF filters, each of which may include one or more RF resonators 104 as described herein, integrated with one or more III-N transistors 102. The RF resonators 104 may include FBARs, Lamb wave resonators, contour-wave resonators, etc. An individual resonator of an RF filter may include a layer of a piezoelectric material such as aluminum nitride (AlN), enclosed between a bottom electrode and a top electrode, with a cavity provided around a portion of each electrode in order to allow a portion of the piezoelectric material to vibrate during operation of the filter. In some embodiments, an RF filter may be implemented as a plurality of RF filters, or a filter bank. A filter bank may include a plurality of RF resonators which may be coupled to a switch, e. g., the RF switch 2534, configured to selectively switch any one of the plurality of RF resonators on and off (i.e., activate any one of the plurality of RF resonators), in order to achieve desired filtering characteristics of the filter bank (i.e., in order to program the filter bank). For example, such a filter bank may be used to switch between different RF frequency ranges when the RF device 2500 is, or is included in, a BS or in a UE device. In another example, such a filter bank may be programmable to suppress TX leakage on the different duplex distances. Any of the RX path pre-mix filter 2514, the RX path post-mix filter 2518, the TX post-mix filter 2524, and the TX pre-mix filter 2528 may include one or more filter banks as described herein.

The impedance tuner 2532 may include any suitable circuitry, configured to match the input and output impedances of the different RF circuitries to minimize signal losses in the RF device 2500. For example, the impedance tuner 2532 may include an antenna impedance tuner. Being able to tune the impedance of the antenna 2502 may be particularly advantageous because antenna's impedance is a function of the environment that the RF device 2500 is in, e.g. antenna's impedance changes depending on, e.g., if the antenna is held in a hand, placed on a car roof, etc.

As described above, the RF switch 2534 may be used to selectively switch between a plurality of instances of any one of the components shown in FIG. 9, in order to achieve desired behavior and characteristics of the RF device 2500. For example, in some embodiments, an RF switch may be used to switch between different antennas 2502. In other embodiments, an RF switch may be used to switch between a plurality of RF resonators (e.g., by selectively switching RF resonators on and off) of any of the filters included in the RF device 2500.

In various embodiments, one or more of the III-N transistors as described herein may be particularly advantageous when used in any of the duplexer 2504, RX path amplifier 2512, RX path pre-mix filter 2514, RX path post-mix filter 2518, TX path amplifier 2522, TX path pre-mix filter 2528, TX path post-mix filter 2524, impedance tuner 2532, and/or RF switch 2534.

The RF device 2500 provides a simplified version and, in further embodiments, other components not specifically shown in FIG. 9 may be included. For example, the RX path of the RF device 2500 may include a current-to-voltage amplifier between the RX path mixer 2516 and the ADC 2520, which may be configured to amplify and convert the downconverted signals to voltage signals. In another example, the RX path of the RF device 2500 may include a balun transformer for generating balanced signals. In yet another example, the RF device 2500 may further include a clock generator, which may, e.g., include a suitable PLL, configured to receive a reference clock signal and use it to generate a different clock signal which may then be used for timing the operation of the ADC 2520, the DAC 2530, and/or which may also be used by the local oscillator 2506 to generate the local oscillator signals to be used in the RX path or the TX path.

SELECT EXAMPLES

The following paragraphs provide various examples of the embodiments disclosed herein.

Example A1 provides an IC structure that includes a support structure (e.g., a substrate), a RF resonator provided over a first portion of the support structure, and an III-N transistor provided over a second portion of the support structure.

Example A2 provides the IC structure according to example A1, where the RF resonator includes a bottom electrode, a top electrode, a piezoelectric material provided between the bottom electrode and the top electrode, a cavity surrounding at least a portion of the bottom electrode, and a cavity surrounding at least a portion of the top electrode.

Example A3 provides the IC structure according to example A2, where the piezoelectric material includes aluminum and nitrogen (e.g., AlN).

Example A4 provides the IC structure according to examples A2 or A3, where a thickness of the piezoelectric material provided between the bottom electrode and the top electrode is between about 100 and 2000 nanometers.

Example A5 provides the IC structure according to any one of the preceding examples A, where the III-N transistor includes an III-N channel material, and a polarization material (e.g., a semiconductor material having stronger piezo-polarization behavior/properties than the III-N channel material), where at least a portion of the polarization material forms a heterojunction interface with at least a portion of the III-N channel material.

Example A6 provides the IC structure according to example A5, where the III-N channel material includes gallium and nitrogen (e.g., GaN).

Example A7 provides the IC structure according to examples A5 or A6, where a thickness of the III-N channel material is between about 5 and 100 nanometers, e.g., between about 10 and 50 nanometers.

Example A8 provides the IC structure according to any one of examples A5-7, where the polarization material includes aluminum, indium, gallium, and nitrogen (e.g., $Al_xIn_yGa_zN$).

Example A9 provides the IC structure according to any one of examples A5-8, where a thickness of the polarization material is between about 2 and 50 nanometers, e.g., between about 10 and 30 nanometers.

Example A10 provides the IC structure according to any one of examples A5-9, where the III-N transistor further includes a buffer material provided between the III-N channel material and the support structure, where a bandgap of the buffer material is greater than a bandgap of the III-N cannel material.

Example A11 provides the IC structure according to example A10, where the buffer material includes a material including aluminum, gallium, and nitrogen (e.g., AlGaN), or a material including aluminum and nitrogen (e.g., AlN).

Example A12 provides the IC structure according to examples A10 or A11, where a thickness of the buffer material is between about 100 and 5000 nanometers, e.g., between about 250 and 500 nanometers.

Example A13 provides the IC structure according to any one of the preceding examples A, further including a sputtered III-N material provided between the support structure and the III-N channel material, and an epitaxially grown III-N material provided between the sputtered III-N material and the III-N channel material.

Example A14 provides the IC structure according to example A13, where a thickness of the epitaxially grown III-N material between the sputtered III-N material and the III-N channel material is between about 10 and 200 nanometers, e.g., between about 20 and 50 nanometers.

Example A15 provides the IC structure according to examples A13 or A14, where a thickness of the sputtered III-N material between the support structure and the III-N channel material is between about 100 and 2000 nanometers.

Example A16 provides the IC structure according to any one of examples A13-15, where the epitaxially grown III-N material is a single crystalline material, possibly defective, i.e., including a certain amount of dislocations.

Example A17 provides the IC structure according to any one of examples A13-16, where the sputtered III-N material includes a plurality of different crystalline domains (i.e., the sputtered III-N material is not a single crystalline material).

Example A18 provides the IC structure according to any one of examples A13-17, where a FWHM of an X-ray diffraction peak of the epitaxially grown III-N material is less than about 2 degrees.

Example A19 provides the IC structure according to any one of examples A13-18, where a FWHM of an X-ray diffraction peak of the sputtered III-N material is equal to or greater than about 2 degrees.

Example A20 provides the IC structure according to any one of the preceding examples A, where the RF resonator is one of a plurality of RF resonators included in the IC structure.

Example A21 provides the IC structure according to any one of the preceding examples A, further including one or more insulator materials between one or more of the following the RF resonator and the support structure, the III-N transistor and the support structure, and the RF resonator and the III-N transistor.

Example A22 provides the IC structure according to any one of the preceding examples A, where the support structure is a substrate.

In various further examples, the IC structure according to any one of the preceding examples A may be included in, or used to implement at least a portion of, an RF FE.

Example A23 provides an IC package that includes an IC die and a further IC component, coupled to the IC die. The IC die includes a support structure (e.g., substrate material), a piezoelectric material provided over the support structure, a RF resonator provided over a first portion of the support structure, where the RF resonator includes a first and a second electrodes, and a first portion of the piezoelectric material between the first and the second electrodes, an III-N transistor provided over a second portion of the support structure, where a second portion of the piezoelectric material is between the III-N transistor and the support structure.

Example A24 provides the IC package according to example A23, where the further IC component includes one of a package substrate, an interposer, or a further IC die.

Example A25 provides the IC package according to examples A23 or A24, where the piezoelectric material is an III-N semiconductor material, e.g., a material including aluminum and nitrogen (e.g., AlN).

Example A26 provides the IC package according to any one of examples A23-25, where the piezoelectric material includes a plurality of different crystalline domains (i.e., the piezoelectric material is not a single crystalline material).

Example A27 provides the IC package according to any one of examples A23-26, where a FWHM of an X-ray diffraction peak of the piezoelectric material is equal to or greater than 2 degrees.

Example A28 provides the IC package according to any one of examples A23-27, where a thickness of the piezoelectric material is between about 100 and 2000 nanometers.

Example A29 provides the IC package according to any one of examples A23-28, where the III-N transistor includes an III-N channel material and a polarization material (e.g., a semiconductor material having stronger piezo-polarization behavior/properties than the III-N channel material), where at least a portion of the polarization material may form a heterojunction interface with at least a portion of the III-N channel material, the piezoelectric material is a first piezoelectric material, and the IC die further includes a second piezoelectric material between the first piezoelectric material and the III-N channel material.

Example A30 provides the IC package according to example A29, where the second piezoelectric material is an III-N semiconductor material, e.g., a material including aluminum and nitrogen (e.g., AlN).

Example A31 provides the IC package according to examples A29 or A30, where the second piezoelectric material is a single crystalline material, possibly defective, i.e., including a certain amount of dislocations.

Example A32 provides the IC package according to any one of examples A29-31, where a FWHM of an X-ray diffraction peak of the second piezoelectric material is less than 2 degrees.

Example A33 provides the IC package according to any one of examples A29-32, where a thickness of the second piezoelectric material is between about 10 and 200 nanometers, e.g., between about 20 and 50 nanometers.

Example A34 provides the IC package according to any one of the preceding examples A, where the IC die includes the IC structure according to any one of the preceding examples A, e.g., the IC structure according to any one of examples A1-22.

Example A35 provides an IC structure that includes a support structure (e.g., a substrate) and a transistor. The transistor includes an III-N channel material, and a gate stack. The gate stack includes a gate electrode material and a dielectric material between the gate electrode material and the channel material. The transistor further includes a sputtered III-N material between the III-N channel material and the support structure, and an epitaxially grown III-N material between the III-N channel material and the sputtered III-N material.

Example A36 provides the IC structure according to example A35, where a FWHM of an X-ray diffraction peak of the epitaxially grown III-N material is less than 2 degrees.

Example A37 provides the IC structure according to examples A35 or A36, where a FWHM of an X-ray diffraction peak of the sputtered III-N material is equal to or greater than 2 degrees.

Example A38 provides the IC structure according to any one of examples A35-37, where a thickness of the epitaxially grown III-N material between the sputtered III-N material and the III-N channel material is between about 10 and 200 nanometers, e.g., between about 20 and 50 nanometers.

Example A39 provides the IC structure according to any one of examples A35-38, where a thickness of the sputtered III-N material between the support structure and the III-N channel material is between about 100 and 2000 nanometers.

Example A40 provides the IC structure according to any one of examples A35-39, where the epitaxially grown III-N material is a single crystalline material, possibly defective, i.e., including a certain amount of dislocations.

Example A41 provides the IC structure according to any one of examples A35-40, where the sputtered III-N material includes a plurality of different crystalline domains (i.e., the sputtered III-N material is not a single crystalline material).

Example A42 provides the IC structure according to any one of examples A35-41, where the transistor further includes a source region and a drain region.

Example A43 provides the IC structure according to any one of examples A35-42, where the transistor is in a RF FE.

Example A44 provides the IC structure according to any one of examples A35-43, where the transistor is the III-N transistor of the IC structure according to any one of examples A1-22.

Example A45 provides an IC package that includes an IC die, the IC die including the IC structure according to any one of examples A35-44; and a further IC component, coupled to the IC die.

Example A46 provides the IC package according to example A45, where the further IC component includes one of a package substrate, an interposer, or a further IC die.

Example A47 provides a computing device that includes a carrier substrate and an IC die coupled to the carrier substrate, where the IC die includes the IC structure according to any one of examples A1-22 or the IC structure according to any one of examples A35-44, and/or the IC die is included in the IC package according to any one of examples A23-34 or the IC package according to any one of examples A25-46.

Example A48 provides the computing device according to example A47, where the computing device is a wearable or handheld computing device.

Example A49 provides the computing device according to examples A47 or A48, where the computing device further includes one or more communication chips and an antenna.

Example A50 provides the computing device according to any one of examples A47-49, where the carrier substrate is a motherboard.

Example A51 provides a method of manufacturing an IC structure, the method including providing a piezoelectric material over a support structure, providing a RF resonator, where the RF resonator includes a first and a second electrodes, and a first portion of the piezoelectric material between the first and the second electrodes, and providing an III-N transistor, where a second portion of the piezoelectric material is between the III-N transistor and the support structure.

Example A52 provides the method according to example A51, where providing the piezoelectric material includes performing sputtering to provide the piezoelectric material.

Example A53 provides the method according to example A52, where providing the III-N transistor includes providing an III-N channel material of the III-N transistor, the piezoelectric material is a first piezoelectric material, and the method further includes epitaxially growing a second piezoelectric material over the first piezoelectric material (i.e., over the sputtered piezoelectric material), where the second piezoelectric material is between the first piezoelectric material and the III-N channel material.

Example A54 provides the method according to any one of examples A51-53, where the IC structure is the IC structure according to any one of examples A1-22 or the IC structure according to any one of examples A35-44, and the method includes corresponding further processes to manufacture any of these IC structures.

Example B1 provides 1 an RF device that includes an IC structure. The IC structure includes a die with an III-N transistor integrated thereon, and a RF resonator integrated thereon.

Example B2 provides the RF device according to example B1, where the die includes a III-N semiconductor material, the III-N transistor is provided over a first portion of the III-N semiconductor material, and a second portion of the III-N semiconductor material is between a first electrode and a second electrode of the RF resonator (i.e., the second portion of the III-N semiconductor material is an active III-N material of the RF resonator).

Example B3 provides the RF device according to example B2, further including a first cavity surrounding at least a portion of the first electrode of the RF resonator, and a second cavity surrounding at least a portion of the second electrode of the RF resonator.

Example B4 provides the RF device according to examples B2 or B3, where a thickness of the III-N semiconductor material is between about 100 and 2000 nanometers, including all values and ranges therein.

Example B5 provides the RF device according to any one of examples B2-4, where the III-N semiconductor material is a sputtered III-N semiconductor material.

Example B6 provides the RF device according to example B5, further including an epitaxially grown III-N semiconductor material provided over the first portion of the sputtered III-N semiconductor material.

Example B7 provides the RF device according to example B6, where a FWHM of an X-ray diffraction peak of the sputtered III-N semiconductor material is greater than a FWHM of an X-ray diffraction peak of the epitaxially grown III-N semiconductor material.

Example B8 provides the RF device according to examples B6 or B7, where a FWHM of an X-ray diffraction peak of the epitaxially grown III-N semiconductor material is equal to or less than 2 degrees.

Example B9 provides the RF device according to any one of examples B6-8, where a thickness of the epitaxially grown III-N semiconductor material is between about 10 and 200 nanometers, including all values and ranges therein.

Example B10 provides the RF device according to any one of examples B6-9, further including a III-N semiconductor channel material provided over the epitaxially grown III-N semiconductor material (the III-N semiconductor channel material provided, thereby, over the first portion of the sputtered III-N semiconductor material), where at least a portion of the III-N semiconductor channel material is a channel region of the III-N transistor during operation of the III-N transistor.

Example B11 provides the RF device according to example B10, where the III-N semiconductor channel material includes gallium and nitrogen.

Example B12 provides the RF device according to examples B10 or B11, where a thickness of the III-N semiconductor channel material is between about 5 and 100 nanometers, including all values and ranges therein.

Example B13 provides the RF device according to any one of examples B10-12, further including a polarization material, where at least a portion of the polarization material forms a heterojunction interface with the portion of the III-N semiconductor channel material.

Example B14 provides the RF device according to any one of examples B10-13, further including a buffer material between the III-N semiconductor channel material and the epitaxially grown III-N semiconductor material, where a bandgap of the buffer material is greater than a bandgap of the III-N semiconductor cannel material.

Example B15 provides the RF device according to example B14, where a thickness of the buffer material is between 250 and 500 nanometers.

Example B16 provides the RF device according to any one of examples B1-15, where the RF resonator is an LWR.

Example B17 provides the RF device according to any one of examples B1-15, where the RF resonator is a contour-mode resonator.

Example B18 provides the RF device according to any one of the preceding examples B, where the RF resonator is one of a plurality of RF resonators of a filter bank of the die.

Example B19 provides the RF device according to example B18, where the III-N transistor is included in a switch configured to selectively (e.g., in response to a control signal) turn on and off one or more of the plurality of RF resonators of the filter bank, thereby enabling programmability of the filter bank.

Example B20 provides the RF device according to example B19, where the III-N transistor is included in an amplifier coupled to the filter bank.

Example B21 provides the RF device according to example B20, where the III-N transistor is one of a plurality of III-N transistors included in the amplifier.

Example B22 provides the RF device according to examples B20 or 21, where the amplifier is a low-noise amplifier.

Example B23 provides the RF device according to example B22, where the RF device is an RF receiver.

Example B24 provides the RF device according to any one of examples B1-22, where the RF device is an RF transceiver.

Example B25 provides the RF device according to example B24, where the RF device is a FDD RF transceiver.

Example B26 provides the RF device according to example B25, further including a duplexer.

Example B27 provides the RF device according to any one of the preceding examples B, further including an antenna for receiving and transmitting RF signals.

Example B28 provides the RF device according to any one of the preceding examples B, further including a downconverter for downconverting received RF signals.

Example B29 provides the RF device according to any one of the preceding examples B, further including one or more local oscillators for providing one or more local oscillator signals to be used by the downconverter in downconverting received RF signals.

Example B30 provides the RF device according to any one of the preceding examples B, further including an upconverter for upconverting signals to be transmitted as RF signals.

Example B31 provides the RF device according to any one of the preceding examples B, further including one or more local oscillators for providing one or more local oscillator signals to be used by the upconverter in upconverting the signals to be transmitted.

Example B32 provides the RF device according to any one of the preceding examples B, further including one or more ADCs for converting signals (e.g., received signals) from analog domain to digital domain.

Example B33 provides the RF device according to any one of the preceding examples B, further including one or more DACs for converting signals (e.g., signals to be transmitted) from digital domain to analog domain.

In various further examples B, the IC structure of the RF device according to any one of the preceding examples B is the IC structure according to any one of examples A1-A44.

Example B34 provides an RF FE component, including an IC structure that includes a filter bank, including a plurality of RF resonators; and an III-N transistor, provided on a single die with the filter bank.

Example B35 provides the RF FE component according to example B34, where the III-N transistor is included in a switch to selectively activate one or more RF resonators of the plurality of RF resonators, thus enabling programmability of the filter bank.

Example B36 provides the RF FE component according to example B34, where the III-N transistor is included in an amplifier coupled to the filter bank.

Example B37 provides the RF FE component according to any one of examples B34-36, where the RF FE component includes a sputtered III-N semiconductor material, the III-N transistor includes an epitaxially grown III-N semiconductor material as a channel material, and the III-N transistor further includes a polarization material, where the epitaxially grown III-N semiconductor material is provided between the polarization material and the sputtered III-N semiconductor material.

Example B38 provides the RF FE component according to example B37, where a FWHM of an X-ray diffraction peak of the sputtered III-N semiconductor material is greater than a FWHM of an X-ray diffraction peak of the epitaxially grown III-N semiconductor material.

Example B39 provides the RF FE component according to any one of examples B34-38, where the III-N transistor is an III-N transistor of the RF device according to any one of the preceding examples B (e.g., any one of examples B1-33), and/or each of at least some of the plurality of the RF resonators is an RF resonator of the RF device according to any one of the preceding examples B (e.g., any one of examples B1-33).

Example B40 provides the RF FE component according to any one of examples B34-39, where the RF FE component is included in a base station or in a UE device.

In various further examples B, the IC structure of the RF FE component according to any one of the preceding examples B is the IC structure according to any one of examples A1-A44.

Example B41 provides an electronic device that includes an RF FE component according to any one of the preceding examples B (e.g., any one of examples B34-40), and a further component, coupled to the RF FE component; or an RF device according to any one of the preceding examples B (e.g., any one of examples B1-33), and a further component, coupled to the RF device.

Example B42 provides an electronic device that includes a RF device including a die that includes an III-N transistor and a RF resonator; and a further component, coupled to the RF device.

Example B43 provides the electronic device according to example B42, where the RF device is an RF device according to any one of the preceding examples B (e.g., any one of examples B1-33).

Example B44 provides the electronic device according to examples B42 or B43, where the RF device includes an RF FE component according to any one of the preceding examples B (e.g., any one of examples B34-40).

Example B45 provides the electronic device according to any one of examples B41-44, where the further component includes one of a carrier substrate, a package substrate, an interposer, or an IC die.

Example B46 provides the electronic device according to any one of examples B41-45, where the electronic device is a UE device.

Example B47 provides the electronic device according to any one of examples B41-45, where the electronic device is a base station.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A radio frequency (RF) device, comprising:
- a die, the die including:
  - a first III-N semiconductor material having a first portion and a second portion,
  - a second III-N semiconductor material over the first portion of the first III-N semiconductor material, wherein a full width half maximum (FWHM) of an X-ray diffraction peak of the first III-N semiconductor material is greater than a FWHM of an X-ray diffraction peak of the second III-N semiconductor material,
  - an III-N transistor over the second III-N semiconductor material, and
  - a RF resonator, wherein the second portion of the first III-N semiconductor material is between a first electrode and a second electrode of the RF resonator.

2. The RF device according to claim 1, further comprising:
- a first cavity surrounding at least a portion of the first electrode of the RF resonator, and
- a second cavity surrounding at least a portion of the second electrode of the RF resonator.

3. The RF device according to claim 1, wherein the first III-N semiconductor material is a sputtered III-N semiconductor material.

4. The RF device according to claim 3, wherein the second III-N semiconductor material is an epitaxially grown III-N semiconductor material.

5. The RF device according to claim 1, further comprising a third III-N semiconductor material over the second III-N semiconductor material, wherein at least a portion of the third III-N semiconductor material is a channel region of the III-N transistor.

6. The RF device according to claim 1, wherein the RF resonator is a lamb resonator or a contour-mode resonator.

7. The RF device according to claim 1, wherein the RF resonator is one of a plurality of RF resonators of a filter bank of the die.

8. The RF device according to claim 7, wherein the III-N transistor is a part of a switch to turn on and off one or more of the plurality of RF resonators of the filter bank.

9. The RF device according to claim 7, wherein the III-N transistor is a part of an amplifier coupled to the filter bank.

10. The RF device according to claim 9, wherein the III-N transistor is one of a plurality of III-N transistors included in the amplifier.

11. The RF device according to claim 9, wherein the RF device is an RF receiver or an RF transceiver.

12. The RF device according to claim 1, further comprising an antenna for receiving and transmitting RF signals.

13. The RF device according to claim 1, wherein the second III-N semiconductor material is an epitaxially grown III-N semiconductor material.

14. A radio frequency (RF) component, comprising:
- a first III-N semiconductor material;
- a second III-N semiconductor material;
- a filter bank, comprising a plurality of RF resonators; and
- an III-N transistor, provided on a single die with the filter bank, wherein:
  - a full width half maximum (FWHM) of an X-ray diffraction peak of the first III-N semiconductor material is greater than a FWHM of an X-ray diffraction peak of the second III-N semiconductor material,
  - the III-N transistor further includes a polarization material, and
  - the second III-N semiconductor material is between the polarization material and the first III-N semiconductor material.

15. The RF component according to claim 14, wherein:
- the first III-N semiconductor material includes a sputtered III-N semiconductor material, and
- the second III-N semiconductor material includes an epitaxially grown III-N semiconductor material.

16. An electronic device, comprising:
- an integrated circuit (IC) die that includes an III-N transistor and a resonator; and
- a further component, coupled to the IC die, the further component including one of a carrier substrate, a package substrate, an interposer, or a further IC die,
- wherein:
  - the die includes a first III-N semiconductor material and a second III-N semiconductor material,
  - the first III-N semiconductor material includes a sputtered III-N semiconductor material,
  - the second III-N semiconductor material includes an epitaxially grown III-N semiconductor material,
  - the second III-N semiconductor material is between the III-N transistor and a first portion of the first III-N semiconductor material, and
  - second portion of the first III-N semiconductor material is a portion of the resonator.

17. The electronic device according to claim 16, wherein the electronic device is a user equipment device.

18. The electronic device according to claim 16, wherein the electronic device is a part of a base station.

19. The electronic device according to claim 16, wherein the second portion of the first III-N semiconductor material is between a first electrode and a second electrode of the resonator.

20. The electronic device according to claim 16, wherein a full width half maximum (FWHM) of an X-ray diffraction peak of the first III-N semiconductor material is greater than a FWHM of an X-ray diffraction peak of the second III-N semiconductor material.

* * * * *

UNITED STATES PATENT AND TRADEMARK OFFICE

CERTIFICATE OF CORRECTION

PATENT NO. : 11,502,124 B2
APPLICATION NO. : 16/249577
DATED : November 15, 2022
INVENTOR(S) : Han Wui Then et al.

It is certified that error appears in the above-identified patent and that said Letters Patent is hereby corrected as shown below:

In the Claims

In Column 40, Claim 16, Line 56, delete “second portion” and insert -- a second portion --, therefor.

Signed and Sealed this
Fourteenth Day of February, 2023

Katherine Kelly Vidal

Katherine Kelly Vidal
*Director of the United States Patent and Trademark Office*